United States Patent
Kim et al.

(10) Patent No.: US 9,141,467 B2
(45) Date of Patent: Sep. 22, 2015

(54) SEMICONDUCTOR MEMORY SYSTEM INCLUDING REED-SOLOMON LOW DENSITY PARITY CHECK DECODER AND READ METHOD THEREOF

(71) Applicants: Namshik Kim, Seoul (KR); Seong In Hwang, Ulsan (KR); Hanho Lee, Incheon (KR)

(72) Inventors: Namshik Kim, Seoul (KR); Seong In Hwang, Ulsan (KR); Hanho Lee, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 49 days.

(21) Appl. No.: 13/755,222

(22) Filed: Jan. 31, 2013

(65) Prior Publication Data

US 2013/0254628 A1 Sep. 26, 2013

(30) Foreign Application Priority Data

Mar. 23, 2012 (KR) .................. 10-2012-0030065
Jan. 2, 2013 (KR) .................. 10-2013-0000283

(51) Int. Cl.
*H03M 13/00* (2006.01)
*G06F 11/10* (2006.01)
*H03M 13/15* (2006.01)
*H03M 13/11* (2006.01)

(52) U.S. Cl.
CPC ............ *G06F 11/10* (2013.01); *G06F 11/1044* (2013.01); *H03M 13/1515* (2013.01); *H03M 13/1174* (2013.01); *H03M 13/6516* (2013.01)

(58) Field of Classification Search
CPC .................. H03M 13/1515; H03M 13/6516; H03M 13/1174
USPC .................................................. 714/758, 781
See application file for complete search history.

(56) References Cited

U.S. PATENT DOCUMENTS

| | | | |
|---|---|---|---|
| 8,392,786 B2 * | 3/2013 | Trachewsky et al. | 714/752 |
| 2005/0160351 A1 * | 7/2005 | Ko et al. | 714/801 |
| 2005/0283709 A1 * | 12/2005 | Kyung et al. | 714/758 |
| 2006/0156169 A1 * | 7/2006 | Shen et al. | 714/752 |
| 2006/0156206 A1 | 7/2006 | Shen et al. | |
| 2007/0033480 A1 * | 2/2007 | Lee et al. | 714/758 |
| 2008/0016433 A1 | 1/2008 | Stolpman | |
| 2008/0028271 A1 * | 1/2008 | Chen | 714/752 |
| 2009/0282315 A1 * | 11/2009 | Trachewsky et al. | 714/755 |
| 2010/0122140 A1 * | 5/2010 | Shen et al. | 714/752 |
| 2012/0159285 A1 | 6/2012 | Motwani | |
| 2012/0233521 A1 | 9/2012 | Kwok et al. | |

* cited by examiner

*Primary Examiner* — M. Mujtaba K Chaudry
(74) *Attorney, Agent, or Firm* — Volentine & Whitt, PLLC

(57) ABSTRACT

A semiconductor memory system may include a read data manager configured to store data read from a memory device, a likelihood value mapper configured to map likelihood values to the data output from the data manager and output mapping data, and a decoder configured to perform low density parity check decoding on the mapping data by using a parity check matrix. The parity check matrix may be a k*N×M matrix including k*N×M submatrices, where k, N and M are independently an integer equal to or greater than 2.

17 Claims, 17 Drawing Sheets

$$H = \begin{bmatrix} 1 & 0 & 1 & 0 & 1 \\ 0 & 0 & 1 & 1 & 0 \\ 1 & 0 & 1 & 1 & 0 \end{bmatrix}$$

Check Nodes

C1 [1 0 1 0 1]

C2 [0 0 1 1 0]

C3 [1 0 1 1 0]

Variable Nodes

| V1 | V2 | V3 | V4 | V5 |
|---|---|---|---|---|
| 1 | 0 | 1 | 0 | 1 |
| 0 | 0 | 1 | 1 | 0 |
| 1 | 0 | 1 | 1 | 0 |

Fig. 13

SEMICONDUCTOR MEMORY SYSTEM INCLUDING REED-SOLOMON LOW DENSITY PARITY CHECK DECODER AND READ METHOD THEREOF

CROSS-REFERENCE TO RELATED APPLICATIONS

A claim of priority under 35 USC §119 is made to Korean Patent Application No. 10-2012-0030065, filed on Mar. 23, 2012, the entirety of which is hereby incorporated by reference.

BACKGROUND OF THE INVENTION

The inventive concept described herein generally relates to semiconductor memory systems and, more particularly, to a semiconductor memory system including a Reed-Solomon low density parity check decoder for correcting an error of read data when stored data is read. The inventive concept also relates a read method associated with such a system.

Semiconductor memory devices are memory devices implemented using semiconductors such as silicon (Si), germanium (Ge), gallium arsenide (GeAs), and indium phosphide (InP). Generally, semiconductor memory devices are classified as either volatile memory devices or nonvolatile memory devices depending on their ability to retain stored data in the absence of supplied power.

For a variety of reasons, errors may be included in read data of a semiconductor memory device. Error correction schemes have been studied which employ error correction codes such as a Bose-Chaudhuri-Hocquenghem (BCH) code, a low density parity check (LDPC) code, and a turbo code.

A Reed-Solomon (hereinafter referred to as "RS") code extends to the aforementioned LDPC code to achieve an RS-LDPC code. The RS-LDPC exhibits relatively superior error correction capability because its minimum distance and girth are relatively long. In spite of superior error correction capability, however, the RS-LDPC has a highly random parity check matrix structure. Disadvantageously, the random structure of parity check matrix increases a computation amount and hardware complexity of the RS-LDPC decoder.

SUMMARY OF THE INVENTION

Embodiments of the inventive concept provide a semiconductor memory system and a data read method of the same.

In an aspect of the inventive concept, a semiconductor memory system may include a read data manager configured to store data read from a memory device, a likelihood value mapper configured to map likelihood values to the data output from the data manager and to output mapping data, and a decoder configured to perform low density parity check decoding on the mapping data by using a parity check matrix. The parity check matrix may be a (k*N)×M matrix including k N×M submatrices, where k, N, M are independently an integer equal to or greater than 2. (Herein, "independently" means that k, N and M can all have different values, or that any two or more of k, N and M can have the same value.) The k N×M submatrices may include a first submatrix of an N×M size, and a second submatrix of an N×M size disposed adjacent to the first submatrix and having a same element arrangement as a matrix obtained by cyclically shifting the first submatrix by N in a row direction according to a circulation cycle M. The first submatrix may include a first row that is a binary permutation obtained by converting a code word generated according to a Reed-Solomon code into a symbol position vector, a second row disposed adjacent to the first row and having a same element arrangement as a row obtained by cyclically shifting the first row by 1 according to a circulation cycle N, and a third row disposed adjacent to the second row, having the same element arrangement as a row obtained by cyclically shifting the second row by 1 according to a circulation cycle N, and differing from the first row.

In an exemplary embodiment, the decoder may include a variable node computation unit configured to update values of variable nodes and check nodes with reference a likelihood value or a check node message, and to decode the data according to the updated values of the variable nodes and the check nodes. The decoder may further include a check node computation unit configured to receive the updated values of the variable nodes as a variable node message, and to provide the check node message with reference to the received variable node message. The decoder may further include a first network unit configured to relay transmission of the variable node message from a variable node block to a check node block, and a second network unit configured to relay transmission of the check node message from the check node block to the variable node block.

In an exemplary embodiment, the first network unit or the second network unit may include a switch control unit configured to assign at least one part of the variable node message input from the variable node block to any one of a plurality of channels, and a connection unit including a hard-wired block configured to hard-wire a plurality of input terminals connected to the any one channel at a plurality of output terminals.

In an exemplary embodiment, the switch control unit may assign another part of the variable node message to the any one channel instead of the at least one part of the variable node message according to a clock signal.

In an exemplary embodiment, the first network unit or the second network unit may include a parallel shifter configured to divisionally assign the variable node message to the check nodes according to the parity check matrix, and a shifter controller configured to control the parallel shifter.

In an exemplary embodiment, the N may be the number of elements of a Galois field used to generate the code word according to a Reed-Solomon code.

In an exemplary embodiment, the semiconductor memory system may further include a syndrome checker configured to determine an error correction state based on the low density parity check decoding.

In an exemplary embodiment, according to a result of the determination the decoder outputs a fail message, the read data manager may store additional data read from the memory device in response to the fail message, the likelihood value mapper may map likelihood values of the additional data to output additional mapping data, and the decoding unit may conduct a low density parity check on the additional mapping data by using the parity check matrix.

In an exemplary embodiment, a read voltage for reading the data and a read voltage for reading the additional data may be different from each other.

In an exemplary embodiment, the semiconductor memory system may further include a storage unit configured to store the parity check matrix.

In an exemplary embodiment, the memory device may include a NAND flash memory.

In an exemplary embodiment, the semiconductor memory system is a memory card or a solid state drive including a memory controller and nonvolatile memory, where the memory controller includes an error correction code (ECC) decoder.

In another aspect of the inventive concept, a data read method of a semiconductor memory system may include reading data stored in the semiconductor memory system by using first read voltages, performing low density parity check decoding on the read data by using a parity check matrix, and outputting a result of correcting an error of the read data according to a result of the low density parity check decoding. The parity check matrix may be a (k*N)×M matrix including k N×M submatrices, where k, N and M are independently an integer equal to or greater than 2. The k N×M submatrices may include a first submatrix of an N×M size, and a second submatrix of an N×M size disposed adjacent to the first submatrix and having a same element arrangement as a matrix obtained by cyclically shifting the first submatrix by N in a row direction according to a circulation cycle M. The first submatrix may include a first row that is a binary permutation obtained by converting a code word generated according to a Reed-Solomon code into a symbol position vector, a second row disposed adjacent to the first row and having a same element arrangement as a row obtained by cyclically shifting the first row by 1 according to a circulation cycle N, and a third row disposed adjacent to the second row, having a same element arrangement as a row obtained by cyclically shifting the second row by 1 according to a circulation cycle N, and differing from the first row.

In an exemplary embodiment, the data read method may further include re-reading the stored data using a second read voltage differing from the first read voltage according to a result of the low density parity check decoding, and performing low density parity check decoding on the re-read data using the parity check matrix.

In an exemplary embodiment, the data is read from a NAND flash memory of the semiconductor memory system.

In an alternative aspect of the inventive concept, a data read method of a semiconductor memory system may include reading data stored in the semiconductor memory system by using normal read voltage, restoring a parity check matrix for correcting an error of the read data, performing low density parity check decoding on the read data by using the restored parity check matrix, and outputting a result of correcting an error of the read data according to a result of the low density parity check decoding. Storing the parity check matrix may include reading at least one stored row of the low density parity check matrix, and restoring the low density parity check matrix such that the other rows of the low density parity check matrix each have an element arrangement in which the at least one read row is cyclically shifted by 1 or more in a row direction. The at least one row may be a binary permutation obtained by converting a code word generated according to a Reed-Solomon code into a symbol position vector.

In an exemplary embodiment, the restored parity check matrix may include first and second submatrices which have an N×M size and are arranged in parallel, where N and M are independent an integer equal to or greater than 2. The first submatrix may include the at least one row, a first shift row disposed adjacent to the at least one row and having a same element arrangement as a row obtained by cyclically shifting the at least one row by 1 according to a circulation cycle N, and a second shift row disposed adjacent to the first shift row, having a same element arrangement as a row obtained by cyclically shifting the first shift row by 1 according to the circulation cycle N, differing from the at least one row. The second submatrix may be disposed adjacent to the first submatrix and have a same element arrangement as a matrix obtained by cyclically shifting the first submatrix by N according to a circulation cycle M in a row direction.

In an exemplary embodiment, the data is read from a NAND flash memory of the semiconductor memory system.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

FIG. 13 exemplarily illustrates a parity check matrix according to the inventive concept.

DETAILED DESCRIPTION

The inventive concept will now be described more fully hereinafter with reference to the accompanying drawings, in which preferred embodiments of the inventive concept are shown. However, the inventive concept may be embodied in many different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

The terms used in the present specification are used to describe a particular embodiment and are not used to limit the present invention. As in the present specification, a singular form may include a plural form unless the singular form definitely indicated otherwise in the context. Also, in the present specification, the terms "comprise" and/or "comprising" specify existence of shapes, numbers, steps, operations, members, elements, and/or groups thereof, which are referred to, and do not exclude existence or addition of one or more different shapes, numbers, operations, members, elements, and/or groups thereof.

Figure 1:
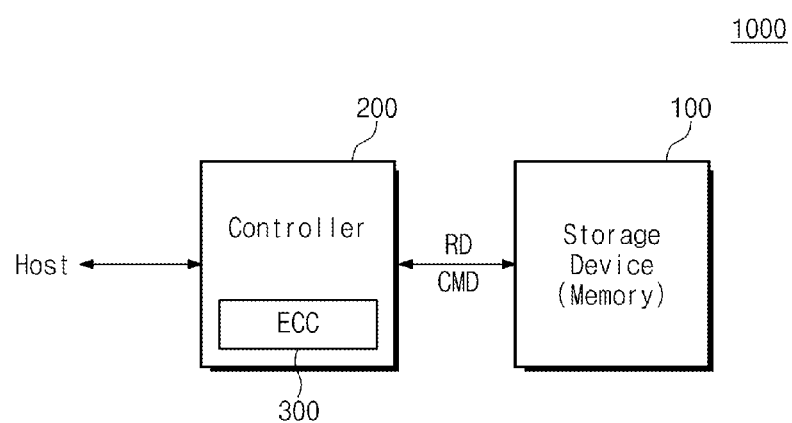
FIG. 1 is a block diagram of a semiconductor memory system according to an embodiment of the inventive concept.

FIG. 1 is a block diagram of a semiconductor memory system 1000 according to an embodiment of the inventive concept. Referring to FIG. 1, the semiconductor memory system 1000 of this example includes a storage device 100 and a controller 200. As an embodiment, the storage device 100 may include a nonvolatile memory device (e.g., flash memory device). In this example, the storage device 100 may store data by adjusting a threshold voltage of memory cells.

The controller 200 is connected to a host and the storage device 100. The controller 200 is configured to access the storage device 100 in response to a request from the host. In FIG. 1, RD denotes read data and CMD denotes one or more commands. For example, the controller 200 is configured to control read, write, erase, and background operations of the storage device 100, to provide an interface between the storage device 100 and the host, and to drive firmware for controlling the storage device 100.

In an exemplary embodiment, the controller 200 is configured to provide a control signal and an address, and to exchange data with the storage device 100.

The controller 200 includes an error correction code decoder (hereinafter referred to as "ECC decoder") 300. The ECC decoder 300 performs decoding using error correction on data read from the storage device 100 to correct an error of the read data. The ECC decoder 300 of this embodiment performs decoding using a Reed-Solomon low density parity check (RS-LDPC) code.

The controller 200 communicates with the host in accordance with a specific communication protocol. For example, the controller 200 communicates with the host through at least one of various types of communication protocols such as USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, IDE (Integrated Drive Electronics) protocol, and firewire protocol.

The inventive concept presents a parity check matrix having a much simpler structure than a typical parity check matrix. Since the presented parity check matrix is generated according to an RS-LDPC code, it retains the superior error correction capability of the RS-LDPC code. Moreover, a random parity check matrix structure, which is the feature of the RS-LDPC code, is improved and thus the presented parity check matrix has a regular and simple structure.

The presented parity check matrix is applied to the ECC decoder 300 to be used to perform LDPC decoding. The ECC decoder 300 may minimize a computation amount required for decoding due to the simplified structure of the parity check matrix while retaining the aforementioned superior error correction performance of the RS-LDPC code. Thus, the decoding efficiency of the semiconductor memory system 1000 may be enhanced.

In addition, the simplified structure of the parity check matrix may allow the ECC decoder 300 to implement a switch network which connects a variable mode and a check node with low hardware complexity. Thus, the overall hardware complexity of the memory semiconductor system 1000 may be reduced and a chip area required for implementing the ECC decoder 300 may be reduced.

Figure 2:
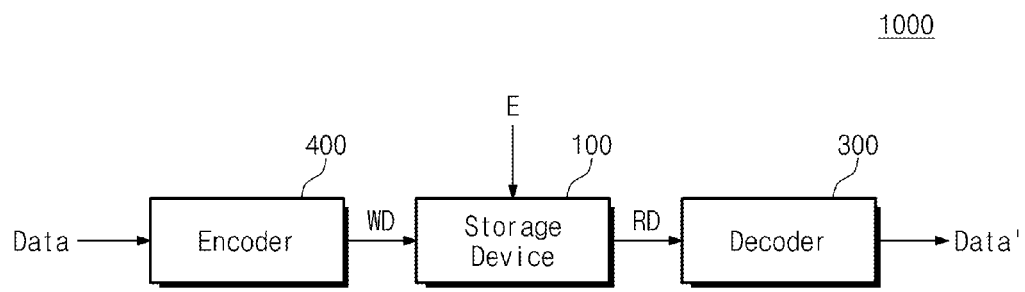
FIG. 2 is a block diagram illustrating a method of decoding data by a semiconductor memory system according the inventive concept.

FIG. 2 is a block diagram illustrating a method of determining data in a semiconductor memory system according to the inventive concept. Referring to FIG. 2, the memory semiconductor system 1000 may further include an encoder 400 in addition to the storage device 100 and the ECC decoder 300 that are shown in FIG. 1. As an embodiment, the encoder 400 may be included in a controller 200 (see FIG. 1).

First, when data is input from a host (see FIG. 1), the input data is encoded by the encoder 400. At this point, the encoder 400 performs LDPC encoding on the input data by using a parity check matrix. The encoded data is programmed into the storage device 100 as write data WD. The write data WD may include parity bits for decoding.

When a read command is received, the semiconductor memory system 1000 reads the data stored in the storage device 100 as read data RD. The read data RD may include an error E which can be caused for a variety of reasons. For example, an error E may be caused by a malfunction when the write data WD is programmed or data loss while the write data WD is stored in the storage device 100. Alternatively, or in addition, an error E may be caused by a malfunction during a read operation of reading the read data RD.

The decoder 300 performs LDPC decoding on the read data RD by using a parity check matrix to remove the error E. The parity check matrix is identical to the parity check matrix used for encoding. A result of the decoding is output as decoded data Data'.

A decoding performance of the decoder 300 is significantly affected by a structure of parity check matrix. As described above, a parity check matrix created using an RS-LDPC code has a better error correction capability than a parity check matrix created using a typical DLPC code, but has also has a complex matrix structure. If a structure of a parity check matrix is complex, the decoder 300 requires more computations for decoding the read data RD. In the LDPC decoding, a complex structure of a parity check matrix increases hardware complexity in a network connection between a variable node and a check node.

The inventive concept presents a parity check matrix which has a block circulation structure in units of submatrices each having a quasi-cyclic structure while keeping the feature of an RS-LDPC code. The parity check matrix has a relatively simple matrix structure. Thus, the decoder 300 performs RS-LDPC decoding using the presented parity check matrix to significantly reduce required computation amount and hardware complexity. A parity check matrix presented according to the inventive concept will be described later in detail with reference to FIGS. 5 to 13.

Figure 3:
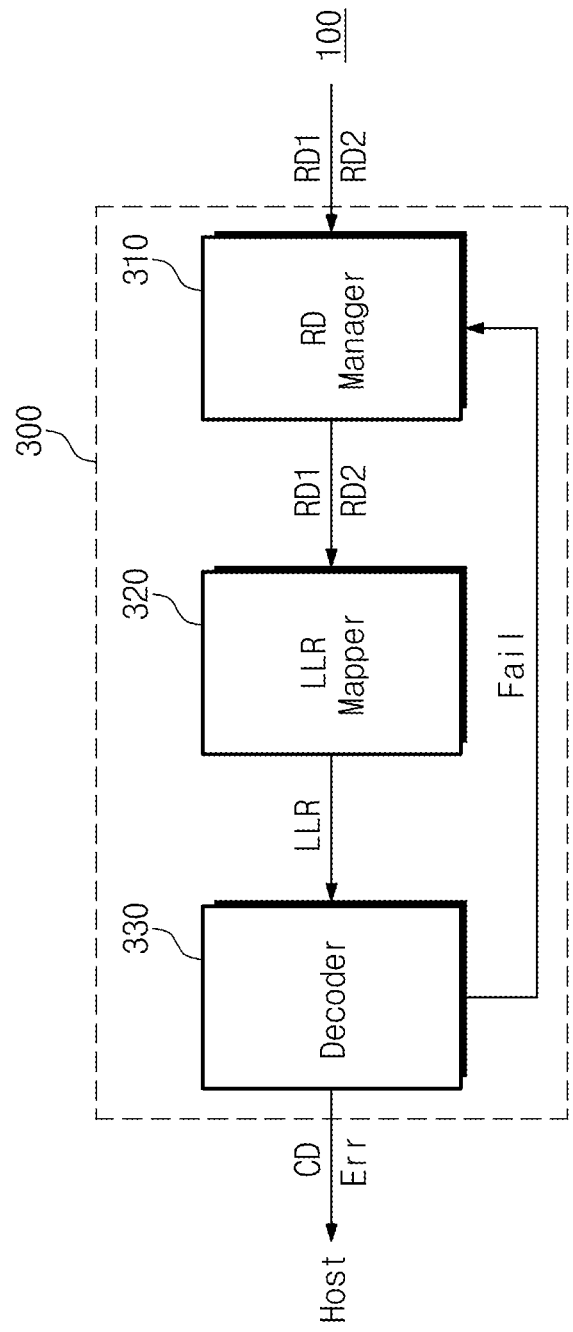
FIG. 3 is a block diagram of an ECC decoder shown in FIG. 1.

FIG. 3 is a block diagram of the ECC decoder 300 shown in FIG. 1. Referring to FIG. 3, the ECC decoder 300 includes a read data manager (RD Manager) 310, a log likelihood value mapper (LLR Mapper) 320, and a decoder 330.

The read data manager 310 receives and stores read data RD (see FIG. 1) read from the storage device 100. The read data RD may include first read data RD1 and second read data RD2.

When a hard decision is conducted, the read data manager 310 receives data read using a normal read voltage from a storage device 100 and stores the received data as first read data RD1. The stored first read data RD1 may be provided to the log likelihood value mapper 320 during a hard decision or soft decision.

When a soft decision is conducted, the read data manager 310 receives data read using a partial read voltage from the storage device 100 and stores the received data as second read data RD2. The partial read voltage means a voltage that is proximate to the normal read voltage but has a different voltage level than the normal read voltage. When the soft decision is conducted, the read data manager 310 provides the second read data RD2 to the log likelihood value mapper 320.

The log likelihood value mapper 320 is configured to map log likelihood values to the provided read data RD1 and RD2. As an embodiment, the log likelihood value mapper 320 may include a hard decision log likelihood value register (not shown) storing log likelihood values to be mapped during a hard decision and a soft decision log likelihood value register (not shown) storing log likelihood values to be mapped during the soft decision.

As an embodiment, during the hard decision, the log likelihood value mapper 320 receives the first read data RD1 from the read data manager 310. The log likelihood value mapper 320 maps the first read data RD1 with corresponding log likelihood values according to each bit value of the first read data RD1.

During the soft decision, the log likelihood value mapper 320 receives the second read data RD2 from the read data manager 310. The log likelihood value mapper 320 maps the second read data RD2 with corresponding log likelihood values according to each bit value of the second read data RD2.

During the hard decision or the soft decision, a result of the mapping carried out by the log likelihood value mapper 320 is output to the decoder 330 as log likelihood value data LLR.

The decoder 330 receives the log likelihood value data LLR from the log likelihood value mapper 320 during the hard decision or the soft decision. The decoder 330 performs LDPC decoding on the received log likelihood value data LLR.

During the hard decision and the soft decision, respective log likelihood value data LLR are LDPC-decoded using the same method and device.

The decoder 330 updates check nodes and variable nodes according to a parity check matrix during the LDPC decoding. The decoder 330 performs provisional decoding according to a result of the update (e.g., posteriori probability) and computes the provisionally decoded data and the parity check matrix to determine whether decoding is correctly performed according to a result of the computation.

As an embodiment, if the result of computation with the parity check matrix is a zero matrix, it is determined that the decoding is correctly performed. If not a zero matrix, it is determined that the decoding is not correctly performed.

If the decoding is correctly performed, the decoder 330 outputs the decoded data as decoded data CD. If the decoding is not correctly performed (i.e., all errors of the read data RD are not corrected), the decoder 330 re-updates the check nodes and the variable nodes.

The above update and provisional decoding of check nodes and variable nodes are iteratively performed. The update and provisional decoding of check nodes and variable nodes may constitute a single decoding loop.

When the hard decision is conducted in the decoder 300 and parity check based on the hard decision is failed, the decoder 330 transmits a fail message Fail to the read data manager 310. The read data manager 310 transmits a read request for the soft decision to a controller (200 in FIG. 1) in response to the fail message Fail. Alternatively, when the hard decision is conducted in the decoder 330 and parity check based on the hard decision is failed, the decoder 330 directly transmits a fail message Fail to the controller 200. The controller 200 may prepare a read operation for the soft decision in response to the fail message Fail or a read request.

When the soft decision is conducted, the second read data RD2 is stored in the read data manager 310. The stored second read data RD2 is provided to the log likelihood value mapper 320 to be used to map corresponding log likelihood values. As an embodiment, when the soft decision is conducted, the first read data RD1 may be provided together with the second read data RD2.

The second read data RD2 is data read using a partial read voltage for additionally obtaining information on threshold voltages of memory cells. During the soft decision, various log likelihood values are mapped based on the additional information depending on the second read data RD2. For example, if a single memory cell is read as '1' by a normal read voltage but read as '1' having a threshold voltage proximate to '0' by a partial read voltage, the memory cell is mapped to have a relatively low log likelihood value. On the other hand, when a single memory cell is read as '1' by a normal read voltage and read to have a threshold voltage that is significantly different from '0' by a partial read voltage, the memory cell is mapped to have a relatively high log likelihood value. Since the additional information on the threshold voltages of the memory cells is used, a decoding accuracy of the soft decision is higher than that of the hard decision.

In the inventive concept, the decoder 330 uses a parity check matrix that follows an RD-LDPC code but has a relatively simple matrix structure. Thus, the decoder 330 may reduce a required computation amount while retaining a high error correction capability. Although described later, particularly since a switching network between variable nodes and check nodes may be implemented with a relatively simple structure, a hardware structure for implementing the decoder 330 may be simplified and a required hardware area may be reduced.

It is noted that general decoder configurations, and general methods of RS-LDPC decoding are well known in the art, and thus details thereof are not explained in further detail.

Figure 4:
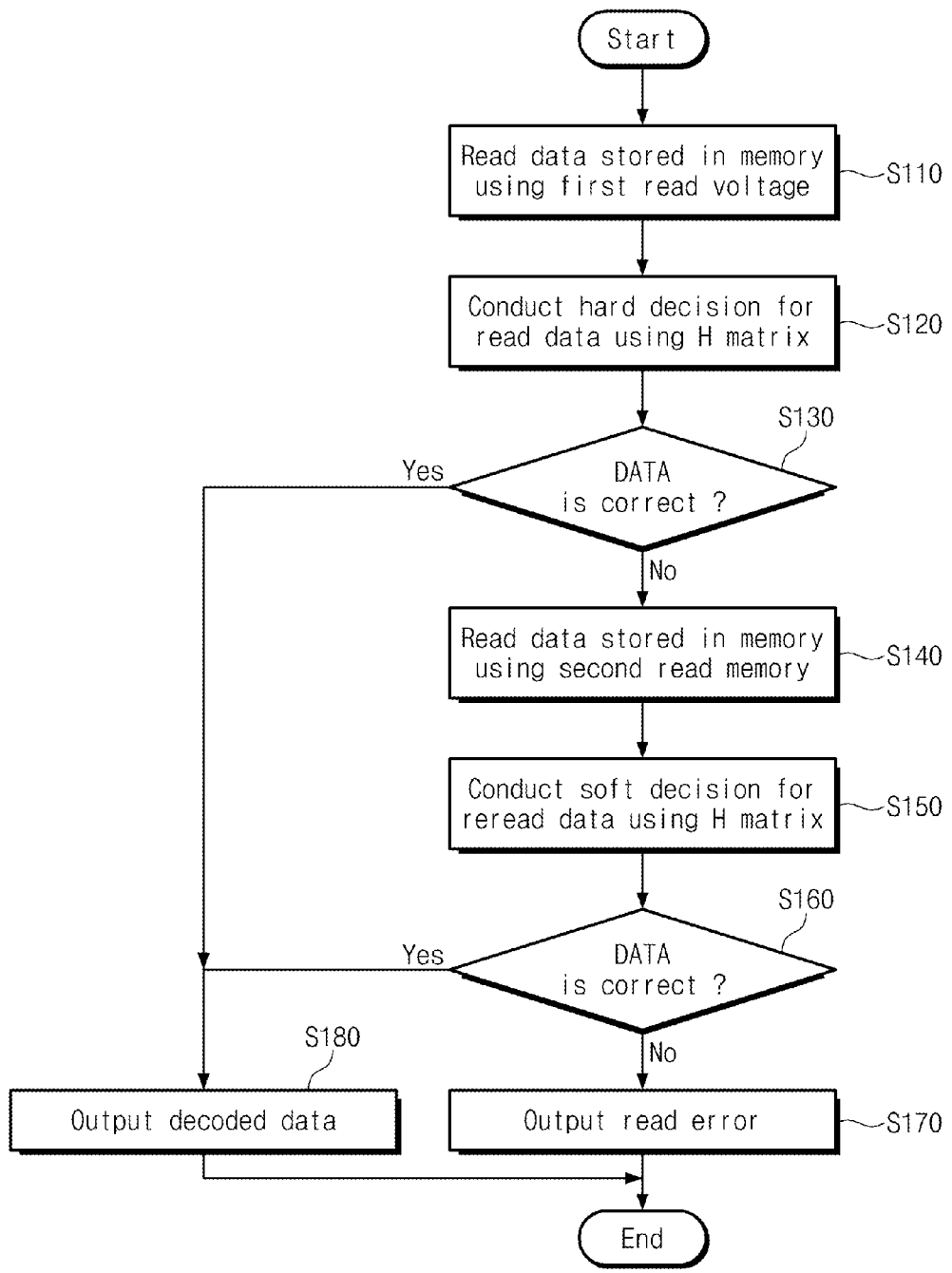
FIG. 4 is a flowchart illustrating a read method of the semiconductor memory device shown in FIG. 1.

FIG. 4 is a flowchart illustrating an embodiment of a read method of the semiconductor memory device 1000 shown in FIG. 1. Referring to FIG. 4, the read method includes steps S110 to S180.

At S110, the semiconductor memory device 1000 reads data stored in a storage device (100 in FIG. 1) as first read data by using a first read voltage. The first read voltage may be the above-described normal read voltage.

At S120, the semiconductor memory device 1000 conducts a hard decision on the first read data by using a presented parity check matrix. Since the presented parity check matrix has a simple matrix structure, the computation amount required for the hard decision is reduced and a hardware complexity of a decoder (330 in FIG. 3) is reduced. The presented parity check matrix will be described in detail later.

At S130, as a result of the hard decision, the semiconductor memory device 1000 determines whether the first read data is decoded without an error. If the decoded data has no error, the flow proceeds to S180. If the decoded data has an error, the flow proceeds to S140.

At S140, the semiconductor memory device 1000 reads the data stored in the storage device 100 as second read data by using a second read voltage. The second read voltage may be the above-described partial read voltage.

At S150, the semiconductor memory device 1000 conducts a soft decision on the second read data by using the presented parity check matrix.

At S160, as a result of the soft decision, the semiconductor memory device 1000 determines whether the first read data and the second read data are decoded without an error. If the decoded data has no error, the flow proceeds to S180. If the decoded data has an error, the flow proceeds to S170.

At S170, the semiconductor memory device 1000 determines that data reading has failed and outputs a read error message. When S170 is terminated, the read method comes to an end.

Returning to S140 or S160, if the flow proceeds to S180, the semiconductor memory device 1000 outputs the decoded data and the read method comes to an end.

As set forth above, a read method of a semiconductor memory device 1000 according to an embodiment of the inventive concept is provided. The read method includes conducting RS-LDPC decoding using a presented parity check matrix. Since the presented parity check matrix has a simplified matrix structure, the read method may reduce the computation amount required for the RS-LDPC decoding and significantly reduce hardware complexity of the decoder 330.

Figures 5, 6:
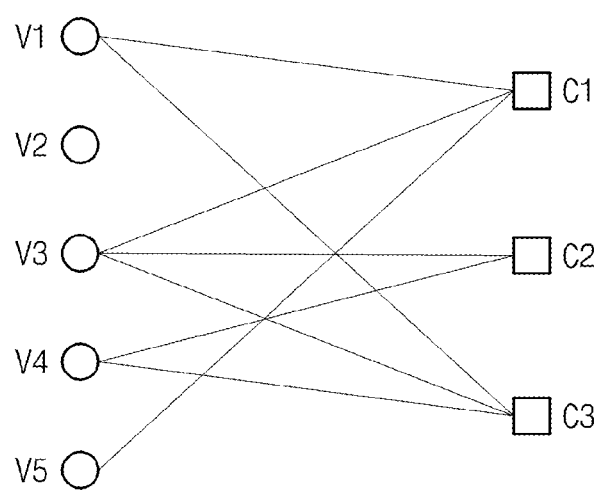
FIG. 5 illustrates a parity check matrix structure of an LDPC code.
FIG. 6 is a Tanner graph illustrating a relationship between variable nodes and check nodes according to a parity check matrix shown in FIG. 5.

FIG. 5 illustrates a parity matrix structure of an LDPC code. Referring to FIG. 5, a parity check matrix H, check nodes C1, C2, and C3, and variable nodes V1, V2, V3, V4, and V5 are shown.

Among elements in the parity check matrix H, elements in a first row, elements in a second row, and elements in a third row form the first to third check nodes C1, C2, and C3, respectively. Among the elements in the parity check matrix H, elements in first to fifth columns may form the first to fifth variable nodes V1, V2, V3, V4, and V5.

As shown in FIG. 5, each element in the parity check matrix H belongs to a check node as well as a variable node. If a certain element in the parity check matrix H is '1', it means that a check node and a variable node belonging to the element are connected to each other. For example, when an element $H_{11}$ of a first row and a first column in the parity check matrix H is '1', a first check node C1 and a first variable node V1 belonging to the element $H_{11}$ are connected to each other.

A parity check matrix H used in the ECC decoder 300 is not limited to the matrix shown in FIG. 5. For example, a parity check matrix having '1' of lower density than the parity check matrix H shown in FIG. 5 may be used in the ECC decoder 300. A size of the parity check matrix used in the ECC decoder 300 is not also limited to 3×5 shown in FIG. 5.

FIG. 6 is a Tanner graph illustrating a relationship between variable nodes and check nodes according to a parity check matrix in FIG. 5. Referring to FIGS. 5 and 6, a connection relationship between the first to third check nodes C1, C2, and C3 and first to the fifth variable nodes V1, V2, V3, V4, and V5 is illustrated.

If a certain element $H_{ij}$ in the parity check matrix H is '1', a check node $C_i$ and a variable node $V_j$ to which the element $H_{ij}$ belongs are connected by a line in the Tanner graph. During LDPC decoding (including RS-LDPC decoding), variable nodes process data and transmits the processed data to connected check nodes. Similarly, during the LDPC decoding (including RS-LDPC decoding), check nodes data processed by the check node to connected variable nodes. Likewise, during the LDPC decoding, the check nodes and the variable nodes repeatedly exchange data according to their relationship.

Returning to FIGS. 4 and 5, among the elements of the first check node C1, an element in the first column, the third column, and the fifth column is '1'. Thus, the first check node C1 is connected to the first variable node V1, the third variable node V3, and the fifth variable node V5. Similarly, since an element of the third column and the fourth column of the second check node C2 is '1', the second check node C2 is connected to the third variable node V3 and the fourth variable node V4. Since an element of the first column, the third column, and the fourth column of the third check node C3 is '1', the third check node C3 is connected to the first variable node V1, the third variable node V3, and the fourth variable node V4.

As an embodiment, connection of the check nodes C1, C2, and C3 and the variable nodes V1, V2, V3, V4, and V5 may be achieved through a separate switch network. As described above, a relationship between nodes is dependent on a value of elements and a matrix structure of a parity check matrix H. Thus, as the structure of the parity check matrix H becomes irregular and complex, the hardware configuration of a switch network also becomes complex.

Figure 7:
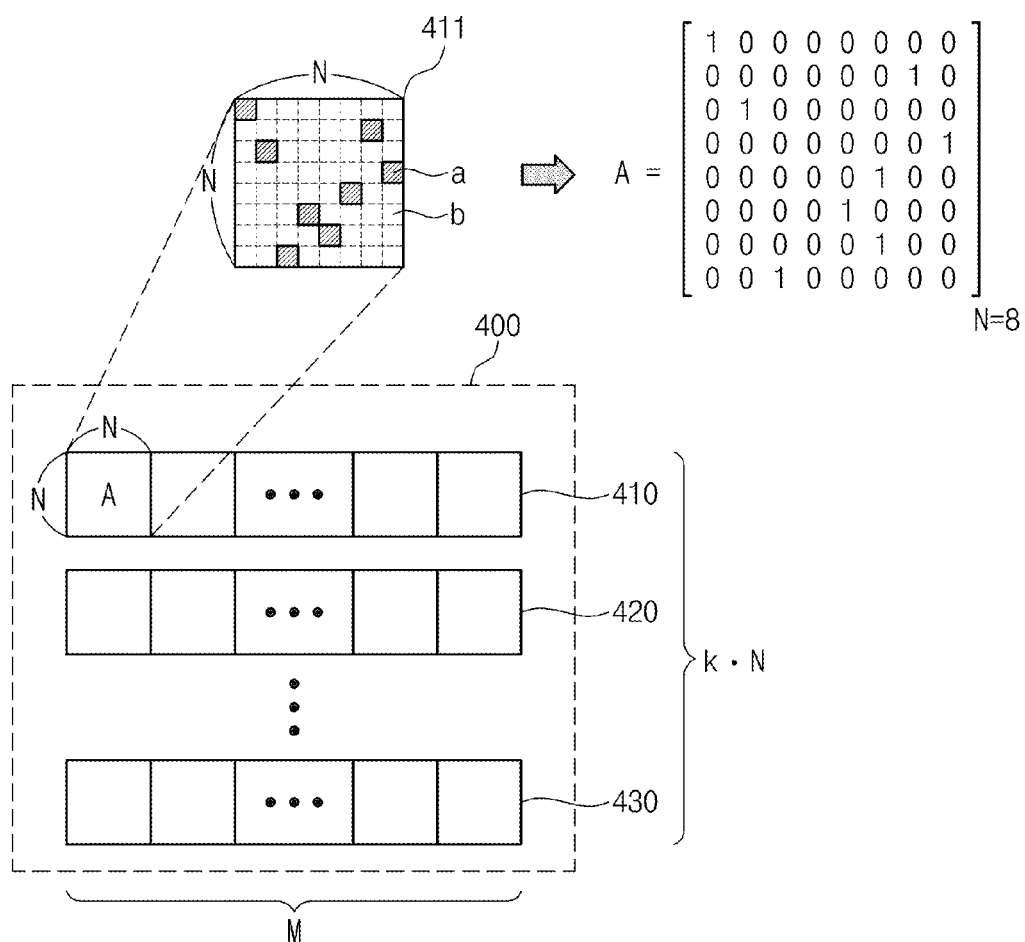
FIG. 7 illustrates a typical parity check matrix based on an RS-LDPC code.

FIG. 7 illustrates a typical parity check matrix 400 based on an RS-LDPC code. Referring to FIG. 7, the parity check matrix 400 may include a plurality of submatrices 410, 420, and 430.

Each row of the submatrices 410, 420, and 430 includes, as an element, a binary permutation obtained by converting a code word generated according to the Reed-Solomon (RS) code into a symbol position vector.

In addition, each of the submatrices 410, 420, and 430 includes a plurality of N×N square matrices (N being the number of elements of Galois-field used to protect a code word according to the Reed-Solomon (RS) code).

In FIG. 7, an embodied version 411 of an A matrix among the plurality of N×N square matrices is shown. Exemplarily, let it be assumed that N=8. The A matrix is expressed by a plurality of squares constituting a lattice shape having eight rows and eight columns. A black square (a) means that a corresponding element is '1', while a white square (b) means that a corresponding element is '0'.

For example, if the black square (a) is positioned at a fourth row and an eighth column in the A matrix 411, an element of the fourth row and the eighth column in the A matrix is '1'. On the other hand, if the white square (b) is positioned at a fifth row and an eighth column in the A matrix 411, an element of the fifth row and the eighth column in the A matrix is '0'.

As shown in the A matrix 411 of FIG. 7, the typical parity check matrix 400 based on an RS-LDPC code has a random matrix structure. That is, the parity check matrix 400 does not have a specific regularity in arrangement of elements (whether each of the elements is '0' or '1'). Since all the N×N square matrices of the parity check matrix 400 have a random matrix structures similar to the a matrix 411, a decoder using the parity check matrix 400 has a very complex hard configuration and the computation amount required accordingly increases.

Figure 8:
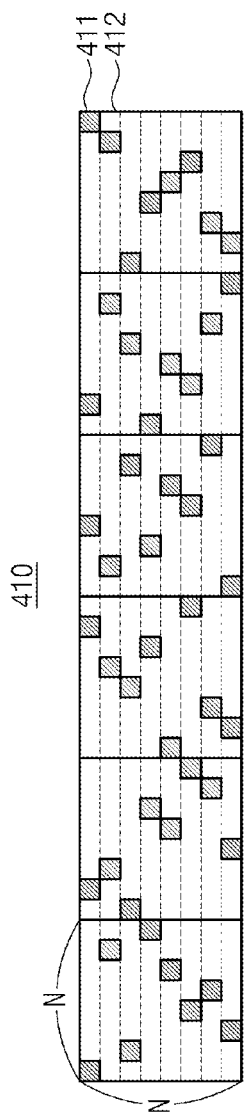
FIG. 8 illustrates a first submatrix among a plurality of submatrices of the parity check matrix shown in FIG. 7.

FIG. 8 illustrates a first submatrix 410 among the plurality of submatrices of the parity check matrix in FIG. 7. Referring to FIG. 8, the first submatrix 410 includes, for example, six N×N square matrices arranged in series.

According to FIG. 8, a first row 411 of the first submatrix 410 has the same matrix structure (or element arrangement) as first rows of the six N×N square matrices are arranged in series. Similarly, a second row 412 of the first submatrix 410 has the same matrix structure (or element arrangement) as second rows of the six N×N square matrices are connected in series. That is, a $p^{th}$ row of the first submatrix 410 has the same matrix structure (or element arrangement) as $p^{th}$ rows of the N×N square matrices.

As explained in FIG. 7, each row in the first submatrix 410 includes, as an element, a binary permutation obtained by converting a code word generated according to the Reed-Solomon (RS) code into a symbol position vector.

Since a method of generating a code word according to an RS code and converting the generated code word into a symbol position vector is well known in the art, its procedure will be described in brief.

First, a generation polynomial of RS code is generated using a Galois field. The Galois field is a field including limited number of elements by which arithmetic operations are defined. The generation polynomial of RS code may be expressed by the equation (1), as follows:

$$g(X) = (X-\alpha)(X-\alpha^2), \ldots, (X-\alpha^{\rho-2})$$
$$= g_0 + g_1 X + g_2 X^2 + \ldots + X^{\rho-2}$$

Equation (1)

wherein a coefficient gi of each term of the generation polynomial g(X) represents an element in the Galois field, and each coefficient gi is not zero because the generation polynomial g(X) is the minimum weight code polynomial.

A code word set coset is generated from the generation polynomial g(X). For achieving this, a generation matrix Gb is created from the coefficients of the generation polynomial g(X). A detailed method of creating the generation matrix Gb is well known in the art and will not be described in further detail.

If a first row and a second row of the generation matrix are respectively r1 and r2, a linear combination of the two rows r1 and r2 may form a code word set. The code word set formed by the combination of the two rows r1 and r2 may be defined by the equation (2), as follows:

$$C_b^{(i)} = \{\alpha^{i-2} r_1 + \beta(r_1 + r_2) : \beta \in GF(p^s)\}$$

Equation (2)

wherein $GF(P^s)$ represents a Galois field including $P^S$ elements, P represents a prime number, s represents a positive integer, and α and β represent primitive elements of the Galois field, respectively.

A code word set ($C_b^{(i)}$) shown in the equation (2) is referred to as a coset. All code words constituting a single coset have an independent relationship.

Code words of the coset are converted into a symbol position vector to generate binary permutations. Each of the generated binary permutations constitutes each row in a parity check matrix based on an RS-LDPC code. A method of generating each row of a parity check matrix based on an RS-LDPC code is well known in the art and will not be described in further detail.

Since two rows of the generated parity check matrix H are '1' only in at most one position at the same time, the parity check matrix H does not have a cycle of length 4 and a size of girth is at least 6. Thus, an RS-LDPC code has better error correction performance than a typical LDPC code. Meanwhile, since each row in a parity heck matrix H generated according to an RS code is independent and random in element structure, a structure of the parity check matrix H becomes very complex.

Referring to FIG. 8, a matrix structure of the first submatrix 410 is shown. Since the respective rows of the first submatrix 410 have independent element structures (e.g., arrangement order of '0' element and '1' element of each row), the entire matrix structure of the first submatrix 410 is also complex and random.

Figure 9:
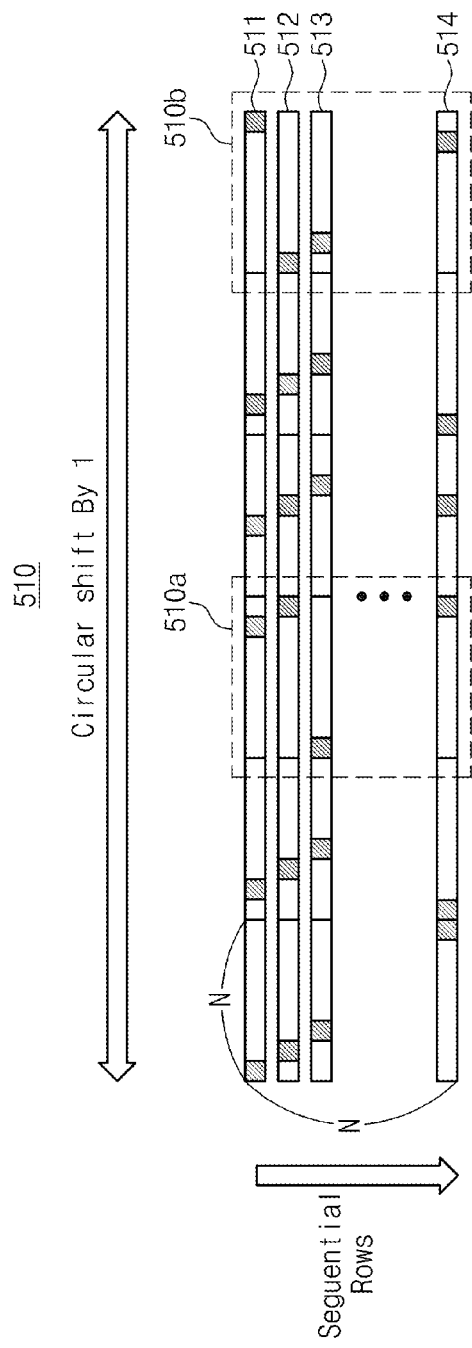
FIGS. 9 to 11 illustrate a presented parity check matrix according to the inventive concept.
Figure 10:
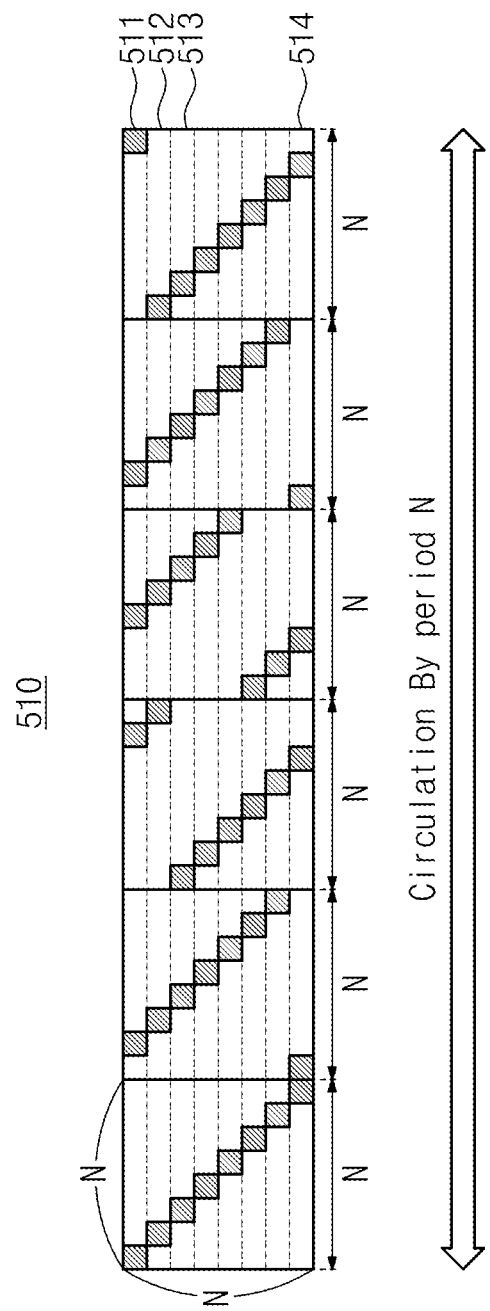
Figure 11:
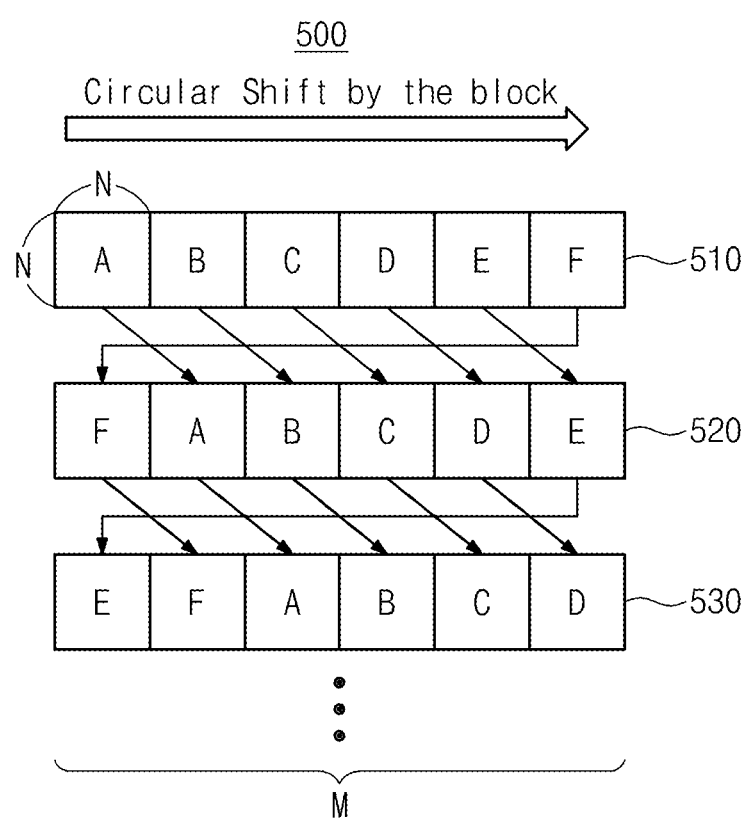

FIGS. 9 to 11 illustrate a presented parity check matrix 500 according to the inventive concept. In FIG. 9, a method of generating a first submatrix 510 of the presented parity check matrix 500 is illustrated. In FIG. 10, a matrix structure of the first submatrix 510 of the presented parity check matrix 500 is exemplarily shown. In FIG. 11, a method of generating the other submatrices of the parity check matrix 500 using the first submatrix 510 is illustrated.

Referring to FIG. 9, a first row 511 of the first submatrix 510 is generated according to an RS code. That is, a binary permutation obtained by converting any one of code words generated according to the RS code into a symbol position vector is determined to be a first row 511 of the first submatrix 510. A detailed method of generating the first row 511 according to the RS code is identical to that explained above.

When the first row 511 is generated, the other rows of the first submatrix 510 are generated by cyclically shifting the first row 511 to create the presented parity check matrix according to the inventive concept. At this point, the first row 511 is cyclically shifted by 1 in cycle of N times to generate a second row 512 to an Nth row 514 (N being the number of elements of the Galois field used to generate a code word according to an RS code).

More specifically, the first two 511 is cyclically shifted by 1 in a row direction to generate a second row 512. The second row 512 is cyclically shifted by 1 in the row direction to generate a third row 513.

In the same manner, a $p^{th}$ row is cyclically shifted by 1 in the row direction to generate a $(p+1)^{th}$ row, (p being a positive greater than or equal to 1 and less than or equal to N−1). Since each row is cyclically shifted in cycle of N times, elements of an $N^{th}$ column, an $2N^{th}$ column, ..., and $p \cdot N^{th}$ column of the $p^{th}$ row become elements of a first column, an $(N+1)^{th}$ column, ..., and $((p-1) \cdot N+1)^{th}$ column of the $(p+1)^{th}$ row, respectively.

As shown in FIG. 9, let it be assumed that the first submatrix 510 includes six N×N square matrices and has 6·N columns. However, since the first submatrix 510 is generated by converting a code word according to an RS code, each of the N×N square matrices of the first submatrix 510 is a square matrix in which only one element has a value of '1' in one row.

In this case, since the respective rows of the first submatrix 510 are cyclically shifted mutually in cycle of N times, each of the N×N square matrices constitutes a single cycle. Thus, the last element (or $N^{th}$ element) of the $p^{th}$ row in the N×N square matrix becomes a first element of the $(p+1)^{th}$ row in the N×N square matrix.

That is, in each of the N×N square matrices, first to $(N-1)^{th}$ elements of the $p^{th}$ row are shifted to second to $N^{th}$ elements of the $(p+1)^{th}$ row, respectively and an $N^{th}$ element of the $p^{th}$ row that is the end of the cycle is cyclically shifted to be a first element of the next row (i.e., $(p+1)^{th}$ row).

For example, a first row of a third N×N square matrix 510a in the first submatrix 510 is '1'. Since a second row is a cyclically shifted version of the first row, an $(N-1)^{th}$ element of the first row becomes an $N^{th}$ element of the second row. Thus, the $N^{th}$ element of the second row is '1'. Since a third row is a cyclically shifted version of the second row and a circulation cycle is N, the $N^{th}$ element of the second row becomes a first element of the third row. Thus, a first element of the third row is '1'.

Similarly, a first row of a sixth N×N square matrix 510b in the first submatrix 510 is '1'. Since a second row is a cyclically shifted version of the first row, an $N^{th}$ element of the first row is a first element of the second row. Thus, the first element of the second element is '1'.

In the above manner, respective rows in the first submatrix 510 are sequentially and cyclically shifted by 1 (circulation cycle is N) to generate second to $N^{th}$ rows of the first submatrix 510. If the generated N rows are arranged in parallel, the first submatrix 510 is completed. Each N×N square matrix of the completed first submatrix 510 has a quasi-cyclic matrix structure including a plurality of N×N square matrices that circulate on a row-by-row basis.

FIG. 10 illustrates a first submatrix created by the method explained in FIG. 9. Referring to FIG. 10, each row of a first submatrix 510 is created by cyclically shifting an adjacent row by 1 (circulation cycle is N). That is, a second row 512 of the first submatrix 510 is a cyclically shifted result of the first row 512, and a third row thereof is a cyclically shifted result of the second row 512. In the same manner, respective rows in first to eighth rows 514 are cyclically shifted to complete the first submatrix 510.

Referring to FIG. 10, the first submatrix 510 created in the above manner has the overall quasi-cyclic matrix structure. Thus, as compared to the structure of the first submatrix 410 in FIG. 8, the first submatrix 510 according to the inventive concept has a significantly simplified and arranged matrix structure.

Although it has been explained that an adjacent row is generated by cyclically shifting each row by 1 to create a first submatrix 510, the inventive concept is not limited thereto. For example, an adjacent row may be generated by cyclically shifting each row of the first submatrix 510 by a predetermined value greater than 1. In this case, although a matrix structure of the first submatrix 510 may be different from that explained in the foregoing embodiment, position variation of '1' between adjacent rows of the first submatrix 510 has constant regularity. Thus, since a parity check matrix has a simplified structure, hardware complexity and the computation amount of an ECC decoder (300 in FIG. 1) may be reduced.

FIG. 11 illustrates a method of completing the parity check matrix 500 using the first submatrix 510. Referring to FIG. 11, the parity check matrix 500 includes a plurality of submatrices including first to third submatrices 510, 520, and 530.

In FIG. 11, the first submatrix 510 is created in the method described in FIGS. 9 to 11. That is, the first matrix 510 may be created by sequentially performing a method of creating the next row by cyclically shifting one row of the first submatrix 510.

In this embodiment, as shown in FIG. 11, a second submatrix 520 adjacent to the first submatrix 510 is created by cyclically shifting the first submatrix 510 on a block-by-block basis. A third submatrix 530 adjacent to the second submatrix 520 is created by cyclically shifting the second submatrix 520 on a block-by-block basis. Similarly, $(k+1)^{th}$ submatrix (k being an integer equal to or greater than 1) is created by cyclically shifting a $k^{th}$ submatrix on a block-by-block basis. If all the submatrices of the parity check matrix 500 are created through cyclic shift on a block-by-block basis, they are coupled in parallel to complete the parity check matrix 500. The block as a unit of cyclic shift may be an N×N square matrix explained in FIGS. 9 and 10.

For example, similar to FIG. 11, let it be assumed that a first submatrix 510 of a parity check matrix 500 includes six blocks (or N×N square matrix) and is an N×N matrix. Six blocks A, B, C, D, E, and F are sequentially arranged in series to constitute a first submatrix 510. A detailed method of creating the first submatrix 510 is identical to that explained in FIGS. 9 and 10. The first submatrix 510 is cyclically shifted on a block-by-block basis to create a second submatrix 520. In this case, the circulation cycle of the first submatrix 510 is six blocks (or M columns).

More specifically, a first block A of the first submatrix 510 is shifted by a circulation cycle on a block-by-block basis to be a second block A of a second submatrix 520. A second block B of the first submatrix 510 is shifted to be a third block B of the second submatrix 520. Similarly, an $n^{th}$ block of the first submatrix 510 (n being an integer of 1 to 5) is shifted to be an $(n+1)^{th}$ block of the second submatrix 520. The last block F of the first submatrix 510 is shifted to a first block F of the second submatrix 520. That is, a block F disposed at the end of the circulation cycle is shifted to the beginning of the circulation cycle by a cyclic shift on a block-by-block basis Likewise, the second submatrix 520 created by cyclically shifting the first submatrix 510 on a block-by-block basis has the same element arrangement as a matrix created by cyclically shifting the first submatrix 510 by N in a row direction according to a circulation cycle M. That is, when the first submatrix 510 is an N×M matrix, one block shift is substantially equal to N column shifts.

Similarly, the second submatrix 520 is cyclically shifted on a block-by-block basis to create a third submatrix 530. Likewise, a $k^{th}$ submatrix is cyclically shifted on a block-by-block basis to create a $(k+1)^{th}$ submatrix and the created submatrices are arranged in parallel to complete the parity check matrix 500. As an embodiment, the parity check matrix 500 may be stored in a storage device (100 in FIG. 1) of a semiconductor memory system (1000 in FIG. 1). Alternatively, the parity check matrix 500 may be stored in a separate storage unit (not shown) incorporated in a controller (200 in FIG. 1). The stored parity check matrix 500 may be called and used to decode read data (RD in FIG. 1).

As set forth in FIGS. 9 to 11, the parity check matrix 500 is circulated on a block-by-block basis and each block has a quasi-cyclic matrix structure. Thus, as compared to a conventional random and complex parity check matrix, the parity check matrix 500 presented according to the inventive concept has a very simplified matrix structure. As a result, the computation amount required for RS-LDPC decoding may be reduced, and the overall hardware complexity including a network configuration connecting a check node and a variable node to each other may be significantly reduced.

Figure 12:
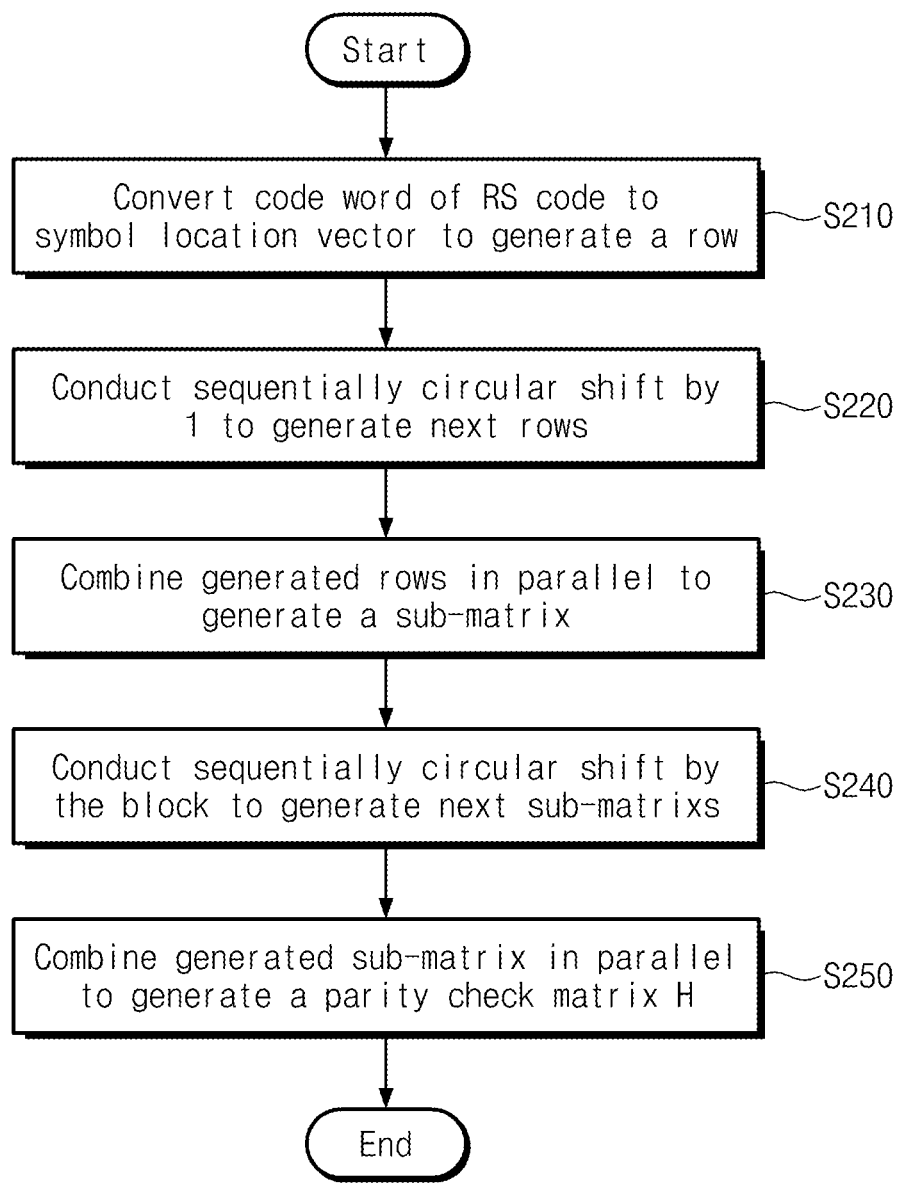
FIG. 12 is a flowchart illustrating a method of creating a presented parity check matrix according to the inventive concept.

FIG. 12 is a flowchart illustrating a method of creating a presented parity check matrix 500 according to the inventive concept. Referring to FIG. 12, the method of creating the parity check matrix 500 includes steps S210 to S250.

At S210, a code word of an RS code is converted into a symbol position vector to generate a first row (511 in FIG. 9) of a first submatrix (510 in FIG. 9). A detailed manner of generating the first row 511 from the code word of the RS code is identical to that explained above.

At S220, the first row 511 is cyclically shifted by 1 to generate a second row 512. The second row 512 is cyclically shifted by 1 to generate a third row 513. In the same manner, generated rows are each cyclically shifted by 1 to generate the next rows until N rows are generated. A detailed manner of cyclically shifting each row is identical to that explained in FIGS. 9 and 10.

At 230, the created rows are arranged in parallel to create the first submatrix 510.

At 240, the first submatrix 510 is cyclically shifted by one block on a block-by-block matrix to create a second submatrix 520. The second submatrix 520 is cyclically shifted by one block on a block-by-block basis to create a third submatrix 530. In the same manner, created submatrices are each cyclically shifted by one block to create the next submatrices until submatrices required for completing the parity check matrix 500 are all created.

At 250, the created submatrices are arranged in parallel to complete the parity check matrix 500.

Although it has been describe herein that the first row 511 is generated from the code word of the RS code, the inventive concept is not limited thereto. For example, a third row 513 may be generated from the code word of the RS code and the other rows may be generated by sequentially and cyclically shifting the third row 513. Even in this case, the fact that the first submatrix 511 has a quasi-cyclic matrix structure does not change.

Although it has been exemplarily described that each row of the first submatrix 511 is generated by cyclically shifting an adjacent row by 1, each of the first submatrix 511 according to the inventive concept may be generated by cyclically shifting an adjacent row by a predetermined value of 2 or more. For example, a $p^{th}$ row (p being an integer of 1 to N−1) may be cyclically shifted by 2 to generate a $(p+1)^{th}$ row and generated rows may be arranged in parallel to create the first submatrix 511.

In addition, although it has been described that a submatrix is cyclically shifted by one block to create an adjacent submatrix, each submatrix of the parity check matrix 500 according to the inventive concept may be created by cyclically shifting an adjacent submatrix by two blocks or more. For example, a $q^{th}$ submatrix (q being an integer equal to or greater than 1) may be cyclically shifted by 2 blocks to create a $(q+1)^{th}$ submatrix and generated submatrices may be arranged in parallel to create the parity check matrix 500.

According to the flowchart described above, the parity check matrix 500 described in FIGS. 9 to 11 may be created.

Figure 13:
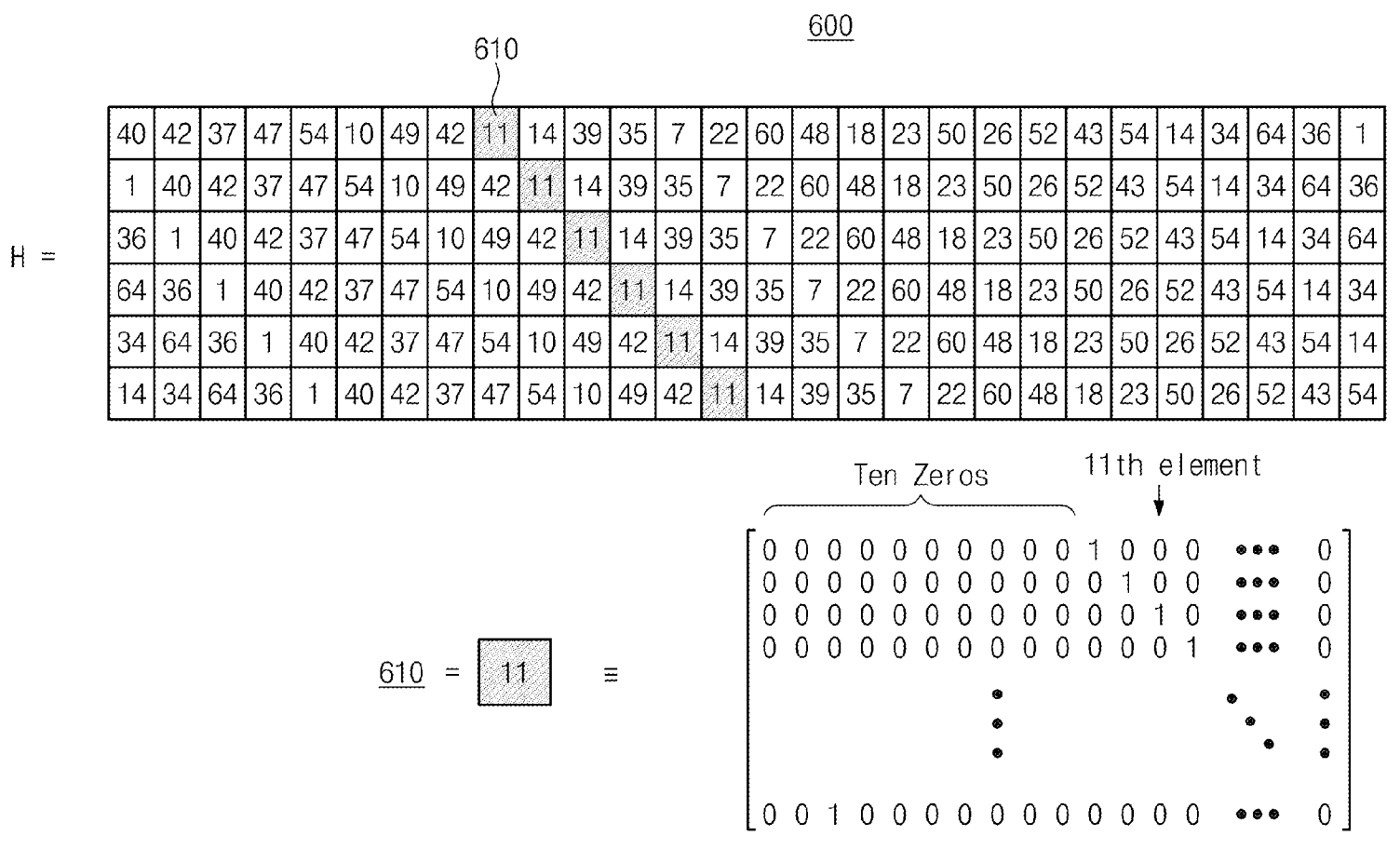

FIG. 13 exemplarily illustrates a parity check matrix according to the inventive concept. Referring to FIG. 13, a parity check matrix 600 including a plurality of submatrices each including a plurality of blocks and a matrix structure of a block 610 are shown.

Referring to FIG. 13, the parity check matrix 600 includes six submatrices arranged in parallel in a column direction. Each of the submatrices includes 28 blocks arranged in series in a row direction. The submatrices of the parity check matrix 600 are sequentially block-circulated reciprocally. For example, a $k^{th}$ block of a $p^{th}$ submatrix of the parity check matrix 600 is identical to a $(k+1)^{th}$ block of a $(p+1)^{th}$ submatrix (p being an integer of 1 to 6, and k being an integer of 1 to 27). However, since submatrices of the parity check matrix 600 are block-circulated in a circulation cycle that is the number of blocks included in a single submatrix, an $28^{th}$ block of the $p^{th}$ submatrix is identical to a first block of the $(p+1)^{th}$ submatrix. Likewise, the parity check matrix 600 has a simple matrix structure in which the same blocks are arranged with constant regularity. Thus, a matrix structure of the entire parity check matrix 600 may be easily derived from a matrix structure of a single submatrix.

In FIG. 13, a matrix structure of a block included in the parity check matrix 600 is exemplarily shown. Since each row of the parity check matrix 600 is generated based on a code word of an RS code, each block of the parity check matrix 600 has a single '1' as an element in a single row. That is, if an element of a fifth column of a certain row in a block is '1', the other elements are all '0' except for the element of the fifth column of the row. As described in FIGS. 9 and 10, each block of the parity check matrix 600 has a matrix structure in which circulation is conducted on a row-by-row basis. A number written in each block of the parity check matrix 600 indicates what number of element of each block is '1'. For example, if a number written in a block is 40, it means that a fortieth element of a first row in the block is '1' and the other elements thereof are '0'.

Specifically, a ninth block 610 in a first submatrix of the parity check matrix 600 will now be exemplarily described. A detailed matrix structure of the block 610 is shown at a lower portion in FIG. 13. A number '11' is written in the block 610. Accordingly, a first row of the block 610 is that an eleventh element is '1' and the other elements are '0'. The block 610 has a structure in which circulation is conducted by 1 on a row-by-row basis. That is, a $i^{th}$ element of the $i^{th}$ row in the block 610 and a $(j+1)^{th}$ element of an $(i+1)^{th}$ row in block 610 are identical to each other. As discussed above, the last element of the $i^{th}$ row is identical to a first element of the $(i+1)^{th}$ row.

The above-described detailed matrix structure of the block 610 is shown in FIG. 13. Referring to FIG. 13, an eleventh element of the first row in the block 610 is '1' and the other elements of the first row in the block 610 are '0'. A second row in the block 610 is generated by cyclically shifting the first row by 1 in a row direction. Thus, a twelfth element of the second row is '1' and the other elements of the second row are '0'. In the same manner, all the rows in the block 610 are constituted.

Figure 14:
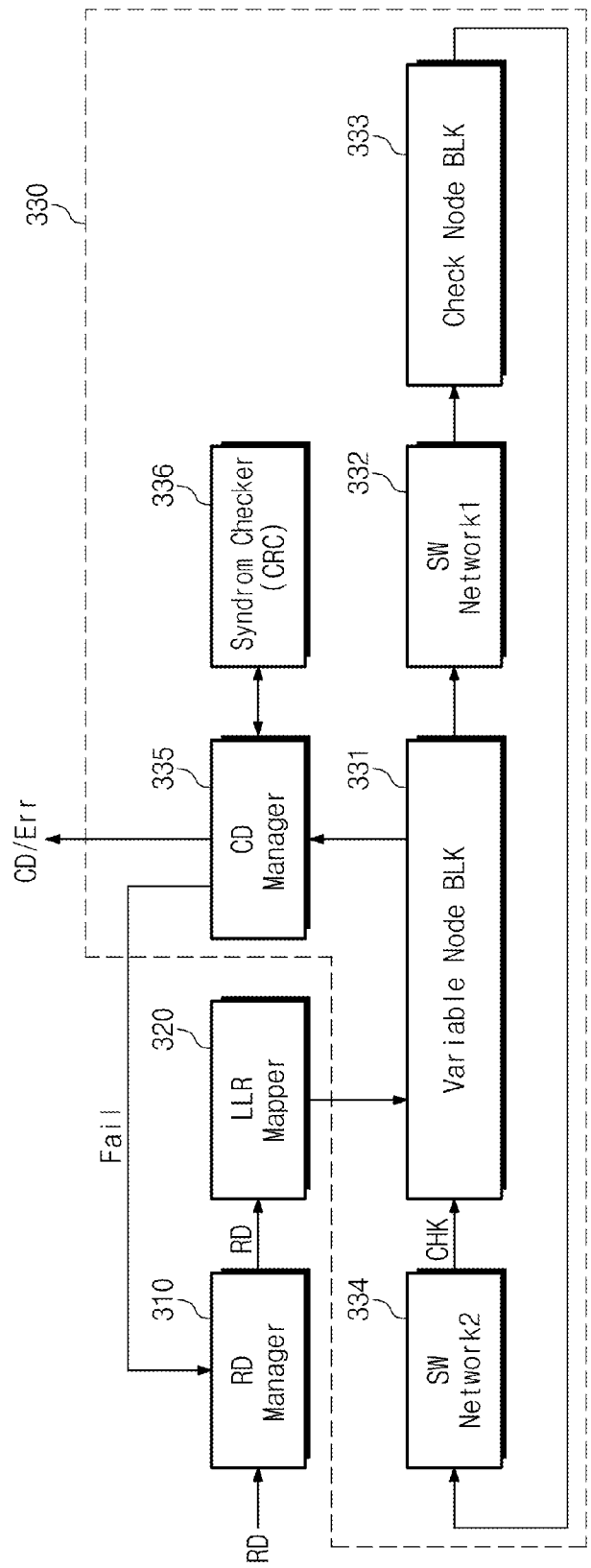
FIG. 14 is a block diagram of a decoder shown in FIG. 3 according to an embodiment of the inventive concept.

FIG. 14 is a block diagram of the decoder 330, shown in FIG. 3, according to an embodiment of the inventive concept. Referring to FIG. 14, the decoder 330 includes a variable node block 331, a check node block 333, an error data manager 335, a syndrome checker 335, and switch networks 332 and 334. In this embodiment, the decoder 330 performs RS-LDPC decoding using a parity check matrix (500 in FIG. 11) presented in FIGS. 9 to 13.

During the RS-LDPC decoding, a nonzero element in the parity check matrix 500 means that a corresponding variable node and a corresponding check node are connected to each other. The decoding is performed through data transmitted according to the connection of the variable node and the check node.

First, when the read data manager 310 transmits received read data RD to a log likelihood value mapper 320, the log likelihood value mapper 320 provides a log likelihood value corresponding to the transmitted read data RD to the decoder 330.

The variable node block 331 stores the provided log likelihood value and provides the stored log likelihood value, as a variable node message, to the check node block 333 through the first switch network 332.

The check node block 331 compares values of variable nodes with respect to each check node with reference to the provided variable node message to provide first and second maximum values as a check node message CHK. The first minimum value means a smallest value among the compared values of variable nodes, and the second minimum value means a second smallest value among the compared values of variable nodes. The check node message CHK is provided to the variable node block 331 through the second switch network 334.

The variable node block 331 updates values of the variable and check nodes with reference to the received check node message CHK. The variable node block 331 performs decoding according to the updated values of the variable and check nodes. A result of the decoding is provided to the error data manager 335 as decoding data.

The error data manager 335 stores the result of the decoding performed in the variable node block 331 and outputs decoding data CD or a read error message Err to an external entity depending on whether decoding of the syndrome checker 336 is successfully performed.

The syndrome checker 336 determines whether the decoding is successfully performed, according to the decoding data stored in the error data manager 335. For example, the syndrome checker 336 multiplies the decoding data by a transpose matrix of the parity check matrix 500 and determines whether the decoding is successfully performed (or whether all errors are corrected) depending on whether a result of the multiplication is a zero matrix. The syndrome checker 336 provides a result of the determination to the error data manager 335.

As an embodiment, the syndrome checker 336 may provide a control message for executing a new decoding loop to the variable node block 331 or the first switch network 332 when the decoding is failed. In the new decoding loop, the variable node block 331 provides the updated values of the variable nodes, as a variable node message, to the check node block 331 in response to a control message. The check node block 331 provides a new check node message to the variable node block 331 with reference to the provided variable node message. The variable node block 331 updates the values of the variable and check nodes with reference to the new check node message and performs decoding according to the updated values of the variable and check nodes. According to a result of the decoding, the syndrome checker 336 determines whether the decoding is successfully performed. According to a result of the determination of the syndrome checker 336, the decoding is terminated or the new decoding loop is iteratively executed.

The first and second switch networks 332 and 334 relay data exchange between the variable node block 331 and the check node block 333. More specifically, the first switch network 332 transmits the variable node message provided from the variable node block 331 to check node block 333. The second switch network 334 transmits the check node message provided from the check node block 333 to the variable node block 331.

In the decoder 330 according to the inventive concept, the parity check matrix 500 has a very regular and simple structure. Thus, a connection relationship between variable nodes and check nodes are also very simple and regular. For this reason, the first and second switch networks 332 and 334 may be easily implemented through a plurality of hard-wired switches or a parallel shifter. The first and second switch networks 332 and 334 may be described in detail later with reference to FIGS. 15 and 16.

As described above, a connection relationship between variable nodes and check nodes is simplified using the parity check matrix 500 of simple structure. Thus, the computation amount and a memory required for data exchange between the variable nodes and the check nodes are reduced. In addition, since the switch networks 332 and 334 relaying the variable node block 331 and the check node block 333 may be implemented with a simple hardware structure, hardware complexity and a hardware area of the decoder 330 may be reduced.

Figure 15:
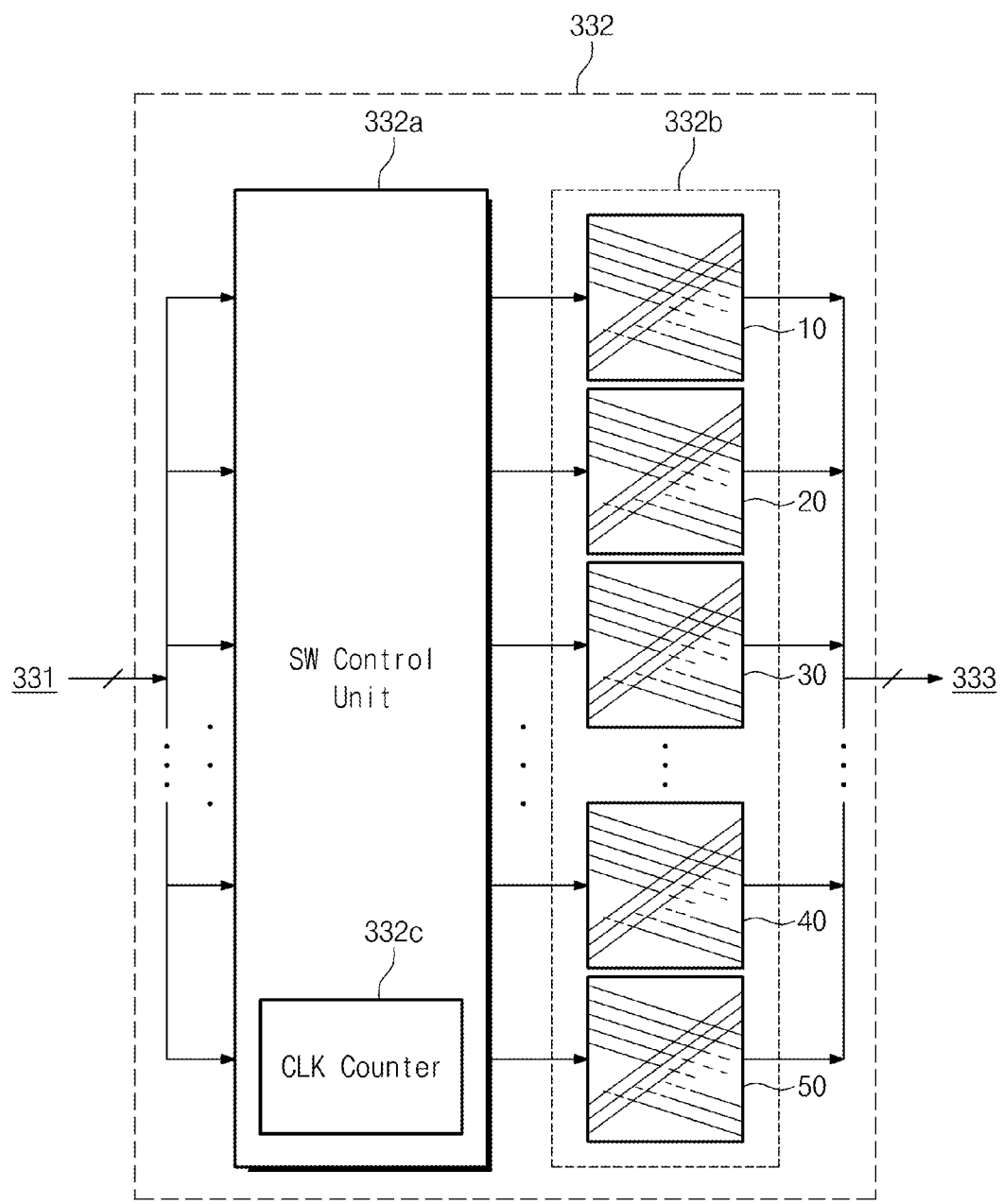
FIG. 15 is a block diagram exemplarily illustrating a switch network in shown FIG. 14.

FIG. 15 is a block diagram exemplarily illustrating a switch network shown in FIG. 14. In FIG. 15, a detailed block diagram of a first switch network (332 in FIG. 14) is shown. Since a second switch network (334 in FIG. 14) has the substantially same configuration as the first switch network 332, the description of the second switch network will be omitted in this embodiment.

Referring to FIG. 15, the first switch network 332 includes a switch control unit 332a and a connection unit 332b.

The switch control unit 332a receives a variable node message from a variable node block 331 and assigns the variable node message to a corresponding one of a plurality of channels in response to a clock signal. The channel to which the variable node message is assigned may vary depending on a clock signal. As an embodiment, the switch control unit 310 may include a clock counter 332c generating a clock signal.

The connection unit 332b includes a plurality of hard-wired blocks 10, 20, 30, 40, and 50 each receiving a variable node message through a channel connected to the switch control unit 332a. The hard-wired blocks 10, 20, 30, 40, and 50 output the received variable node message to a predetermined output path through a hard wire.

Input terminals and output terminals of the respective hard-wired blocks 10, 20, 30, 40, and 50 are connected such that they correspond to one of the N×N square matrices included in a first submatrix (510 in FIG. 10). For example, input terminal and output terminals of the first hard-wired block 10 may be connected such that the first hard-wired block 10 corresponds to an N×N square matrix (A in FIG. 10). Alternatively, input terminals and output terminals of the second hard-wired block 30 may be connected such that the second hard-wired block 30 corresponds to an N×N square matrix (C in FIG. 10). The detailed configuration of the hard-wired blocks 10 and 30 a relationship between the N×N square matrices A and C will be described later with reference to FIGS. 16 and 17.

The first switch network 332 only includes hard-wired blocks corresponding to the connection unit 332b and may relay corresponding data transmission to the entire parity check matrix 500.

For example, when a clock signal indicates the first submatrix 510, the switch control unit 332b sequentially assigns the variable node message corresponding to the first submatrix 510 to the hard-wired blocks 10, 20, 30, 40, and 50. When the clock signal indicates a second submatrix (520 in FIG. 10), the switch control unit 332b shifts a channel to which the variable node message is assigned by one block to sequentially assign the variable node message from the second hard-wired block 20. The last part of the variable node message is assigned to the first hard-wired block 10. Each submatrix of the parity check matrix 500 has a reciprocally block-circulated matrix structure. Thus, the overall variable nodes may be connected to check nodes through a very simple computation that simply shifts a channel to which the variable node message is assigned according to the clock signal. For this reason, the computation amount and a memory required for connecting the variable nodes to the check nodes are reduced. In addition, since a switch network is implemented using minimum number of hard-wired blocks, hardware complexity and a hardware area of a decoder (330 in FIG. 14) may be minimized.

Figure 16:
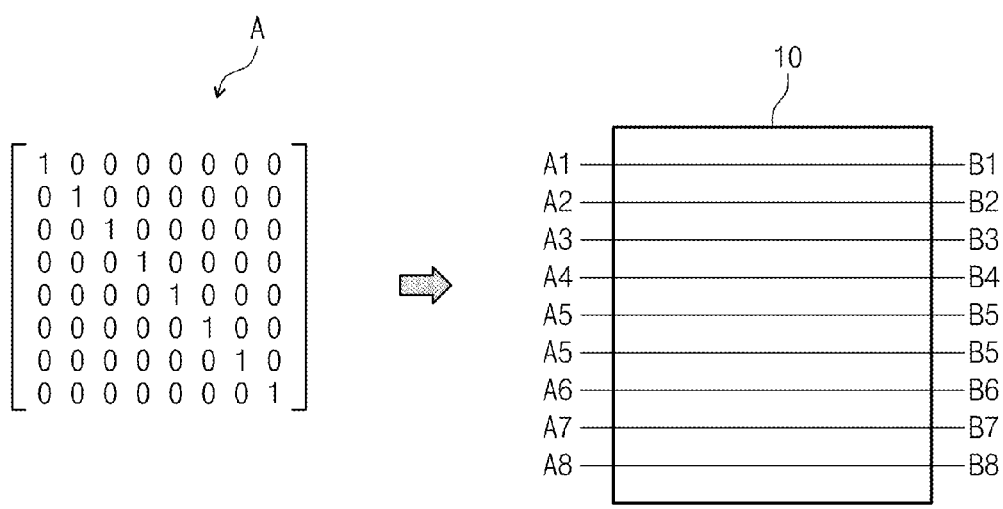
FIGS. 16 and 17 exemplarily illustrate a hard-wired block of a switch network according to the inventive concept.
Figure 17:
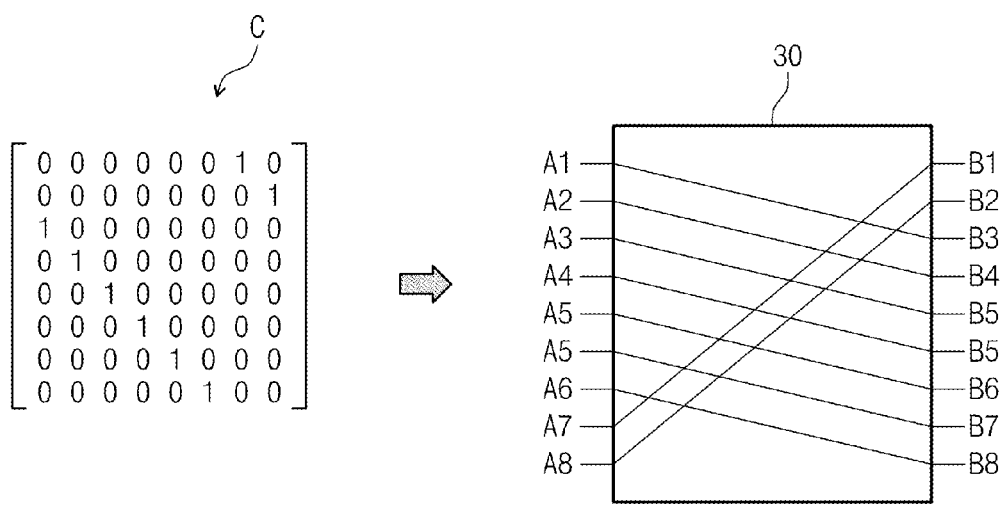

FIGS. 16 and 17 exemplarily illustrate a hard-wired block of a switch network according to the inventive concept.

FIG. 16 shows an input-output connection relationship of a first hard-wired block (10 in FIG. 15), and FIG. 17 shows an input-output connection relationship of a third hard-wired block (30 in FIG. 15). It is assumed for discussion that the first and third hard-wired blocks 10 and 30 have an input-output relationships corresponding to N×N square matrices (A and C in FIG. 10), respectively.

Referring to FIG. 16, a connection relationship between the N×N square matrix A and the first hard-wired block 10 is shown. The N×N square matrix A is that an element of a first column and a first row is '1' and the other elements of the first row are '0'. In a parity check matrix (500 in FIG. 10) according to an embodiment of the inventive concept, the N×N square matrix A has a matrix structure in which circulation is conducted on a row-by-row basis. Thus, the N×N square matrix A is that an element of an $i^{th}$ row and $i^{th}$ column is '1' (i being an integer equal to or less than N) and the other elements are '0'.

In the parity check matrix 500, an element '1' means that a corresponding variable node and a corresponding check node are connected to each other while an element '0' means that a corresponding variable node and a corresponding check node are not connected to each other. Thus, variable node terminals A1, A2, A3, A4, A5, A6, A7, and A8 of the first hard-wired block 10 are hard-wired at check node terminals B1, B2, B3, B4, B5, B6, B7, and B8 according to the N×N square matrix A.

In this case, when a clock signal indicates a first submatrix (510 in FIG. 10), a switch control unit 332a may assign a first part of an input variable node message to a channel connected to the first hard-wired block 10. The first part of the variable node message means variable node values generated from variable nodes corresponding to the first N×N square matrix A of the first submatrix 510.

When the clock signal indicates a second submatrix (520 in FIG. 10), the switch control unit 332a may assign a second part of an input variable node message to a channel connected to the first hard-wired block 10. The second part of the variable node message means variable node values generated from variable nodes corresponding to the second N×N square matrix A of the second submatrix 520. A variable node-check node connection relationship of the second N×N square matrix A of the second submatrix 520 has the same regularity as a variable node-check node connection relationship of the first N×N square matrix A of the first submatrix 510. For this reason, a variable node message is correctly assigned to a corresponding check node through the above channel shift even when a submatrix corresponding to an input variable node message is changed.

Referring to FIG. 17, a connection relationship between N×N square matrix C and a first hard-wired block 30 is shown. The N×N square matrix C is that an element of a first row and a seventh column is '1' and the other elements are '0'. In a parity check matrix (500 in FIG. 10) according to the inventive concept, the N×N square matrix C has a matrix structure in which circulation is conducted on a row-by-row basis. Thus, similar to the N×N matrix A, the N×N square matrix C is cyclically shifted by 1 on a row-by-row basis.

Accordingly, variable node terminals A1, A2, A3, A4, A5, A6, A7, and A8 of the third hard-wired block 30 are sequentially hard-wired at check node terminals B3, B4, B5, B6, B7, B8, B1, and B2.

In this case, when a clock signal indicates a first submatrix (510 in FIG. 10), a switch control unit 332a may assign a third part of an input variable node message to a channel connected to the third hard-wired block 30. The third part of the variable node message means variable node values generated from variable nodes corresponding to the third N×N square matrix C of the first submatrix 510.

When the clock signal indicates a second submatrix (520 in FIG. 10), the switch control unit 332a may assign a fourth part of an input variable node message to a channel connected to the third hard-wired block 30. The fourth part of the variable node message means variable node values generated from variable nodes corresponding to the fourth N×N square matrix C of the second submatrix 520. Thus, the switch network 15 may shift a channel connected to a hard-wired block to correctly assign a variable node message to a corresponding check node.

Adjacent submatrices of the parity check matrix 500 have a relationship where they are shifted by one block. Thus, all variable nodes and check nodes of the parity check matrix 500 may be connected through the same hard-wired blocks (10, 20, 30, 40, and 50 in FIG. 15).

Although only the configuration and operation of the first switch network 332 have been described herein, the second switch network 334 operates in substantially the same manner as the first switch network 332. However, a difference between the first and second switch networks 332 and 334 is that the second switch network 334 receives a check node message from a check node block 333 and outputs the check node message to a variable node block 331.

Although an example of implementing the first and second switch networks 332 and 334 using hard-wired blocks has been described herein, the first and second switch network 332 and 334 may be implemented using a parallel shifter (not shown).

The parity check matrix 500 according to an embodiment of the inventive concept has a matrix structure in which block circulation is conducted at each submatrix. Thus, the parallel shifter may shift an input/output path in parallel based on the variable node-check node connection relationship of a first submatrix 510 to relay data transmission between variable and check nodes with respect to the overall parity check matrix 500.

As an embodiment, first and second switch networks may include a parallel shifter and a control unit controlling the parallel shifter. The detailed configuration and operation of a switch network including a parallel shifter are well known in the art and will not be described in further detail.

Figure 18:
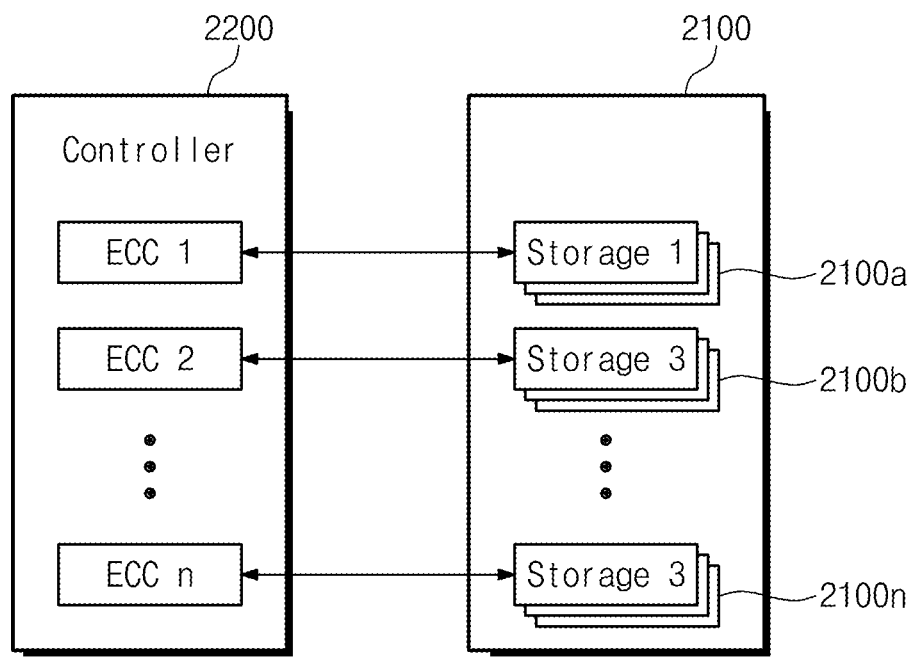
FIG. 18 is a block diagram illustrating an application example of the semiconductor memory system shown in FIG. 1.

FIG. 18 is a block diagram illustrating an application example of the semiconductor memory system 1000 in FIG. 1. Referring to FIG. 18, a semiconductor memory system 2000 includes a storage device 2100 and a controller 2200. The storage device 2100 includes a plurality of storage chips. The plurality of chips is divided into a plurality of groups 2100a, 2100b, and 2100c.

The plurality of storage chips are configured to communicate with the controller 2200 through a single common channel in each group. Exemplarily, the plurality of storage chips may communicate with the controller 2200 through a plurality of channels which are allocated to the plurality of groups, respectively.

The controller 2200 includes a plurality of ECC decoders ECC1, EE2, . . . , and ECCn each having the same configuration as an ECC decoder (300 in FIG. 3) explained in FIG. 3. The ECC decoders ECC1, ECC2, . . . , and ECCn correct an error of data read from the storage device 2100.

The ECC decoders ECC1, ECC2, . . . , and ECCn are provided as many as the number corresponding to the number of channels connecting the controller 2200 to the storage device 2100. A single ECC decoder corrects an error of storage chips connected to a single chip.

In this embodiment, the ECC decoders ECC1, ECC2, . . . , and ECCn perform RS-LDPC decoding on data read from the storage device 2100. The ECC decoders ECC1, ECC2, . . . , and ECCn transmit data between variable nodes and check nodes and decode read data by using a parity check matrix (500 in FIG. 10) explained in FIGS. 9 to 13. The parity check matrix 500 according to the inventive concept has a simple matrix structure while retaining an error correction performance of RS-LDPC code. Thus, the memory system 2000 according to the embodiment of the inventive concept may reduce hardware complexity of the ECC decoder 300 while having high error correction performance.

In FIG. 18, it has been described that a plurality of storage chips are connected to a single channel. However, the storage system 2000 may be modified such that a single chip is connected to a single channel.

Figure 19:
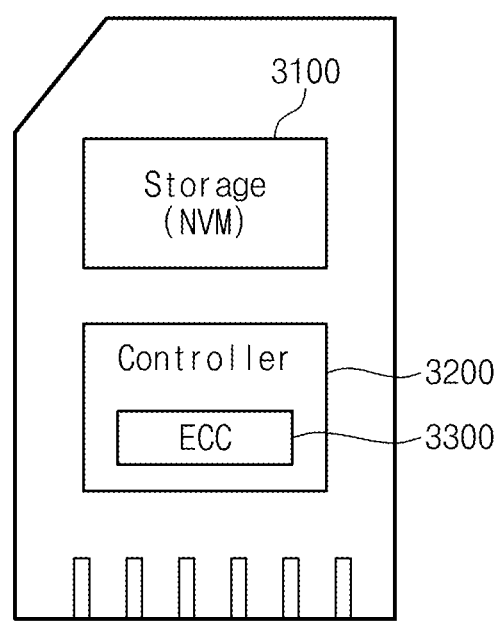
FIG. 19 illustrates a memory card according to an embodiment of the inventive concept.

FIG. 19 illustrates a memory card 3000 according to an embodiment of the inventive concept. Referring to FIG. 19, the memory card 3000 includes a storage device 3100 and a controller 3200. The storage device may be a nonvolatile memory device such as a flash memory.

The controller 3200 includes an ECC decoder 3300 which is similar to that described in FIG. 3. The ECC decoder 3300 corrects an error of data read from the storage device 3100.

As described above, the ECC decoder 3300 transmits data between variable nodes and check nodes and decodes read data by using a parity check matrix (500 in FIG. 10) having a simplified structure. A parity check matrix 500 according to the inventive concept has a simple matrix structure while retaining an error correction performance of an RS-LDPC code. Thus, the memory card 3000 according to the embodiment of the inventive concept may reduce hardware complexity of the ECC decoder 3300 while having high error correction performance. In addition, the computation processing amount of the ECC decoder 3300 may be reduced.

The memory card 3000 constitutes memory cards such as a PC card (PCMCIA, personal computer memory card international association), compact flash card (CF), smart media card (SM, SMC), memory stick, multimedia card (MMC, RS-MMC, MMCmicro), SD card (SD, miniSD, microSD, SDHC), universal flash storage (UFS), and the like.

Figure 20:
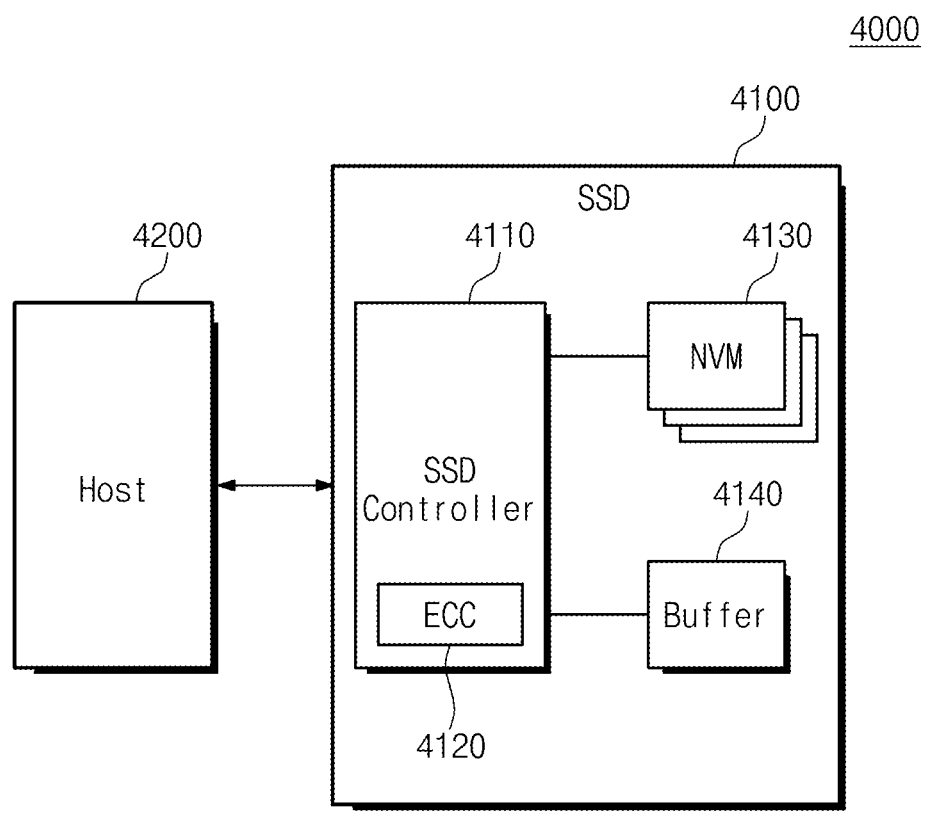
FIG. 20 is a block diagram of a solid state drive according to an embodiment of the inventive concept.

FIG. 20 is a block diagram of a solid-state drive (hereinafter referred to as "SSD") according to an embodiment of the inventive concept. Referring to FIG. 20, a user device 4000 includes an SSD 4100 and a host 4200. The SSD includes a nonvolatile memory device 4130, an SSD controller 4110, an ECC decoder 4120, and a buffer memory 4140.

The SSD controller 4110 provides a physical interface with the host 4200 and the SSD 4100. That is, the SSD controller 4110 provides an interface with the SSD 4100 according to the bus format of the host 4200. In particular, the SSD controller 4110 decodes a command received from the host 4200. According to a result of the decoding, the SSD controller 4110 accesses the nonvolatile memory device 4130. Examples of the bus format of the host 1100 may include USB (Universal Serial Bus), SCSI (Small Computer System Interface), PCI express, ATA, PATA (Parallel ATA), SATA (Serial ATA), and SAS (Serial Attached SCSI).

The buffer memory 4140 temporarily stores write data provided from the host 4200 or data read from the nonvolatile memory device 4130. If the data in the nonvolatile memory device 1230 are cached at a read request of the host 4200, the buffer memory 4140 supports a cache function of directly providing the cached data to the host 4200. Typically, the data transfer rate according to the bus format (e.g., SATA or SAS) of the host 1100 is much higher than the data transfer rate of a memory channel of the SSD 4100. That is, if the interface speed of the host 4200 is much higher, a mass buffer memory 4140 may be provided to minimize the performance degradation caused by the speed difference.

The buffer memory 4140 may include a synchronous DRAM to provide sufficient buffering in the SSD 4100 used as a mass auxiliary memory device. However, it will be readily understood by those skilled in the art that the buffer memory 4140 is not limited to the disclosure herein.

The nonvolatile memory device 4130 may be provided as a storage medium of the SSD 1200. For example, the nonvolatile memory device 4130 may be provided as a NAND flash memory device with mass storage capability. The nonvolatile memory device 4130 may include a plurality of memory devices. In this case, the respective memory devices are connected to the SSD controller 4110 on a channel-by-channel basis. Although it has been described that the storage medium includes the nonvolatile memory device 4130 such as a NAND flash memory device, the storage medium may include other types of nonvolatile memory devices. For example, PRAM, MRAM, ReRAM, FRAM or NOR flash memory devices may be used as the storage medium, and a memory system with a hybrid of different types of memory devices may be applicable.

In the above-described SSD 4100, the SSD controller 4110 includes the same ECC decoder 4120 as described in FIG. 3. The ECC decoder 4120 corrects an error of data read from the nonvolatile memory device 4130.

As described above, the ECC decoder 4120 transmits data between variable nodes and check nodes and decodes read data by using a parity check matrix (500 in FIG. 10) having a simplified structure. A parity check matrix 500 according to the inventive concept has a simple matrix structure while retaining an error correction performance of an RS-LDPC code. Thus, the SSD 4100 according to the embodiment of the inventive concept may reduce hardware complexity of the ECC decoder 4120 while having high error correction performance. In addition, the computation processing amount of the ECC decoder 4120 may be reduced.

Figure 21:
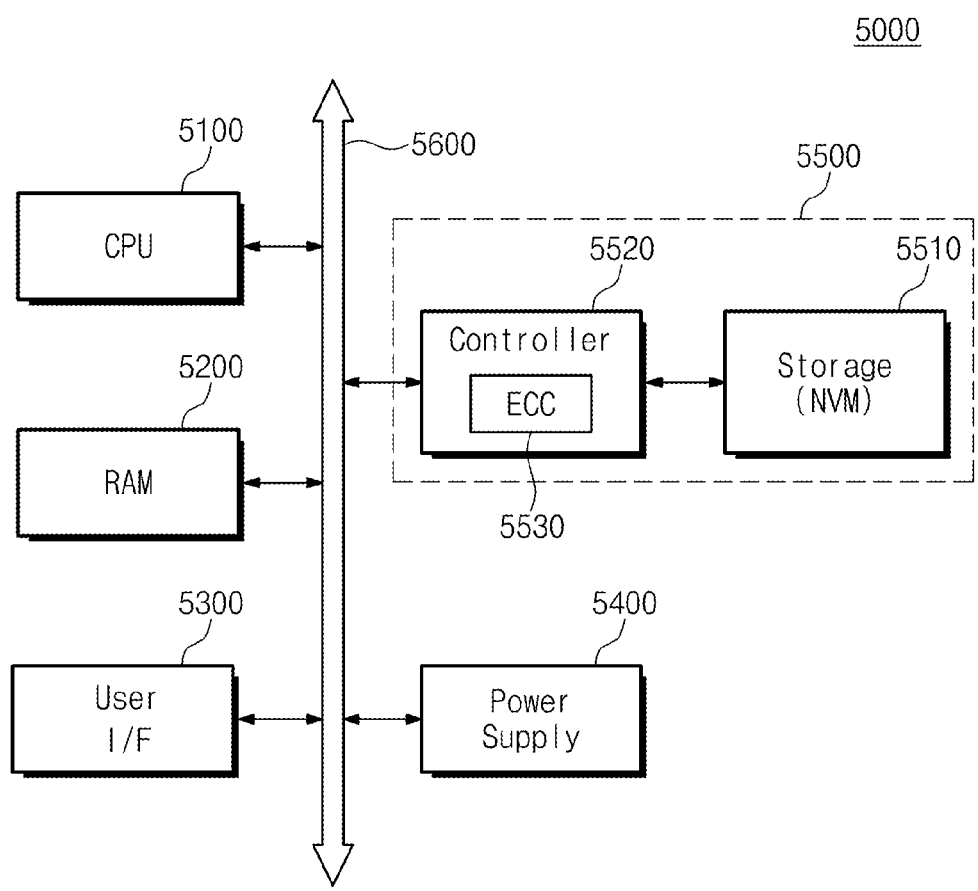
FIG. 21 illustrates the schematic configuration of a semiconductor memory system and a computing system including the semiconductor memory system.

FIG. 21 illustrates the schematic configuration of a semiconductor memory system and a computing system including the semiconductor memory system. Referring to FIG. 21, a computing system 5000 according to the inventive concept may include a nonvolatile memory device 5510, a memory controller 5520, a microprocessor 5100, a random access memory (RAM) 5200, and a user interface 5300 that are electrically connected to a bus 5600.

In the computing system 5000 in FIG. 21, the nonvolatile memory device 5510 may be substantially identical to the nonvolatile memory device (4130 in FIG. 20) described in FIG. 20. The nonvolatile memory device 5510 may be a NAND flash memory device.

The memory controller 5520 may include the same ECC decoder 5530 as the ECC decoder (300 in FIG. 3) described in connection with FIG. 3. The ECC decoder 5530 may correct an error of data read from the nonvolatile memory device 5510. As described above, the ECC decoder 5530 transmits data between variable nodes and check nodes and decodes read data by using a parity check matrix (500 in FIG. 10) having a simplified structure. A parity check matrix 500 according to the inventive concept has a simple matrix structure while retaining an error correction performance of an RS-LDPC code. Thus, a semiconductor memory system device according to the embodiment of the inventive concept and the computing system 5000 including the same may reduce hardware complexity of the ECC decoder 5530 while having high error correction performance. In addition, the computation processing amount of the ECC decoder 5530 may be reduced.

In the case where the computing system according to the present inventive concept is a mobile device, a battery 5400 for providing an operating voltage of the computing system may further be provided. Although not illustrated in the drawing, an application chipset, the computing system according to the present inventive concept may further include a camera image processor (CIS), a mobile DRAM, and the like. A memory controller 6200 and a nonvolatile memory device 6100 may constitute an SSD that uses a non-volatile memory to store data.

A nonvolatile memory device and/or a memory controller according to the inventive concept may be packaged using any of a variety of types of package technologies. For example, a nonvolatile memory device and/or a memory controller according to an embodiment of the inventive concept may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory system comprising:
   a read data manager configured to store data read from a memory device;
   a likelihood value mapper configured to map likelihood values to the data output from the read data manager and to output mapping data; and
   a decoder configured to perform low density parity check decoding on the mapping data by using a parity check matrix,
   wherein the parity check matrix is a (k*N)×M matrix including k N×M submatrices, where k is an integer equal to or greater than 2, and, N are M are independently an integer equal to or greater than 3,
   wherein one of the k N×M submatrices is a first submatrix of an N×M size and another of the k N×M submatrices is a second submatrix of an N×M size,
   wherein the second submatrix is disposed adjacent to the first submatrix and has a same element arrangement as a matrix obtained by cyclically shifting the first submatrix by N in a row direction according to a circulation cycle M, and
   wherein the first submatrix includes:
   a first row that is a binary permutation obtained by converting a code word generated according to a Reed-Solomon code into a symbol position vector; and
   second through Nth rows disposed in succession adjacent to the first row, each of the second through Nth rows having a same element arrangement as a row obtained by cyclically shifting a preceding row by 1 according to a circulation cycle N.

2. The semiconductor memory system as set forth in claim 1, wherein the decoder comprises:
   a variable node computation unit configured to update values of variable nodes and check nodes with reference to a likelihood value or a check node message, and to decode the data according to the updated values of the variable nodes and the check nodes;
   a check node computation unit configured to receive the updated values of the variable nodes as a variable node message, and to provide the check node message with reference to the received variable node message;
   a first network unit configured to relay transmission of the variable node message from a variable node block to a check node block; and
   a second network unit configured to relay transmission of the check node message from the check node block to the variable node block.

3. The semiconductor memory system as set forth in claim 2, wherein the first network unit or the second network unit comprises:
   a switch control unit configured to assign at least one part of the variable node message input from the variable node block to any one of a plurality of channels; and
   a connection unit including a hard-wired block configured to hard-wire a plurality of input terminals connected to the any one channel at a plurality of output terminals.

4. The semiconductor memory system as set forth in claim 3, wherein the switch control unit assigns another part of the variable node message to the any one channel instead of the at least one part of the variable node message according to a clock signal.

5. The semiconductor memory system as set forth in claim 2, wherein the first network unit or the second network unit comprises:
   a parallel shifter configured to divisionally assign the variable node message to the check nodes according to the parity check matrix; and
   a shifter controller configured to control the parallel shifter.

6. The semiconductor memory system as set forth in claim 1, wherein the N is the number of elements of a Galois field used to generate the code word according to a Reed-Solomon code.

7. The semiconductor memory system as set forth in claim 1, further comprising:
   a syndrome checker configured to determine an error correction state based on the low density parity check decoding.

8. The semiconductor memory system as set forth in claim 7, wherein according to a result of the determination the decoder outputs a fail message, the read data manager stores additional data read from the memory device in response to the fail message, the likelihood value mapper maps likelihood values of the additional data to output additional mapping data, and the decoding unit conducts a low density parity check on the additional mapping data by using the parity check matrix.

9. The semiconductor memory system as set forth in claim 8, wherein a read voltage for reading the data and a read voltage for reading the additional data are different from each other.

10. The semiconductor memory system as set forth in claim 3, further comprising:
    a storage unit configured to store the parity check matrix.

11. The semiconductor memory system as set forth in claim 1, wherein the memory device comprises a NAND flash memory.

12. The semiconductor memory system as set forth in claim 1, wherein the memory device comprises nonvolatile memory, and wherein the a read data manager, the likelihood value mapper, and the decoder constitute an error correction code (ECC) decoder of a memory controller of the semiconductor memory system.

13. The semiconductor memory system as set forth in claim 12, wherein the system is a solid state drive including the memory controller and the nonvolatile memory.

14. The semiconductor memory system as set forth in claim 12, wherein the system is a memory card including the memory controller and the nonvolatile memory.

15. A data read method of a semiconductor memory system, comprising:
    reading data stored in the semiconductor memory system by using first read voltages;
    performing low density parity check decoding on the read data by using a parity check matrix; and
    outputting a result of correcting an error of the read data according to a result of the low density parity check decoding, wherein the parity check matrix is a (k*N)×M matrix including k N×M submatrices, where k is an integer equal to or greater than 2, and N and M are independently an integer equal to or greater than 3, wherein one of the k N×M submatrices is a first submatrix of an N×M size and another of the k N×M submatrices is a second submatrix of an N×M size, wherein the second submatrix is disposed adjacent to the first submatrix and has a same element arrangement as a matrix obtained by cyclically shifting the first submatrix by N in a row direction according to a circulation cycle M, and wherein the first submatrix includes:

a first row that is a binary permutation obtained by converting a code word generated according to a Reed-Solomon code into a symbol position vector; and second through Nth rows disposed in succession adjacent to the first row, each of the second through Nth rows having a same element arrangement as a row obtained by cyclically shifting a preceding row by 1 according to a circulation cycle N.

16. The data read method as set forth in claim 15, further comprising:

re-reading the stored data using a second read voltage differing from the first read voltage according to a result of the low density parity check decoding; and performing low density parity check decoding on the re-read data using the parity check matrix.

17. The data read method as set forth in claim 15, wherein the data is read from a NAND flash memory of the semiconductor memory system.

* * * * *